(12) United States Patent
Kanamori et al.

(10) Patent No.: US 11,049,847 B2
(45) Date of Patent: Jun. 29, 2021

(54) SEMICONDUCTOR DEVICE FOR PREVENTING DEFECTS BETWEEN BIT LINES AND CHANNELS

(71) Applicant: Samsung Electronics Co., Ltd., Suwon-si (KR)

(72) Inventors: Kohji Kanamori, Seongnam-si (KR); Yongseok Kim, Suwon-si (KR); Kyunghwan Lee, Hwaseong-si (KR); Junhee Lim, Seoul (KR); Jeehoon Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/734,505

(22) Filed: Jan. 6, 2020

(65) Prior Publication Data
US 2020/0365560 A1   Nov. 19, 2020

(30) Foreign Application Priority Data
May 17, 2019   (KR) .................. 10-2019-0057920

(51) Int. Cl.
*H01L 25/065* (2006.01)
*H01L 25/18* (2006.01)
(Continued)

(52) U.S. Cl.
CPC .......... *H01L 25/0657* (2013.01); *H01L 24/08* (2013.01); *H01L 24/80* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2225/06524* (2013.01); *H01L 2924/1431* (2013.01); *H01L 2924/14511* (2013.01)

(58) Field of Classification Search
CPC .......................... H01L 25/0657; H01L 24/80
See application file for complete search history.

(56) References Cited

U.S. PATENT DOCUMENTS 8,513,731 B2   8/2013  Lee et al.
9,070,446 B1   6/2015  Aritome
(Continued)

*Primary Examiner* — William Coleman
(74) *Attorney, Agent, or Firm* — Harness, Dickey & Pierce, P.L.C.

(57) ABSTRACT

A semiconductor device includes a first semiconductor structure comprising a substrate and a circuit element, and a second semiconductor structure connected to the first semiconductor structure. The second semiconductor structure includes a base layer, a first memory cell structure, a second memory cell structure, and common bit lines between the first memory cell structure and the second memory cell structure. The first memory cell structure includes first gate electrodes, first channel structures, and first string select channel structures. The second memory cell structure includes second gate electrodes, second channel structures, second string select channel structures, and connection regions between the second channel structures and the second string select channel structures. The first memory cell structure further includes first channel pads between the common bit lines and the first string select channel structures, and the second memory cell structure further includes second channel pads extending along the common bit lines.

20 Claims, 24 Drawing Sheets

(51) Int. Cl.
*H01L 23/00* (2006.01)
*H01L 25/00* (2006.01)

(56) References Cited

U.S. PATENT DOCUMENTS

| | | |
|---|---|---|
| 9,502,471 B1 | 11/2016 | Lu et al. |
| 9,515,085 B2 | 12/2016 | Rabkin et al. |
| 9,679,650 B1 | 6/2017 | Sakui |
| 9,881,971 B2 | 1/2018 | Lindenberg |
| 9,922,987 B1 | 3/2018 | Mizutani et al. |
| 9,985,050 B2 | 5/2018 | Fukuzumi et al. |
| 10,079,246 B2 | 9/2018 | Lu et al. |
| 10,103,164 B2 * | 10/2018 | Chen .................. H01L 27/11582 |
| 10,115,681 B1 * | 10/2018 | Ariyoshi ............ H01L 27/11524 |
| 10,685,702 B2 * | 6/2020 | Binfet .................... G11C 16/20 |
| 2017/0352679 A1 | 12/2017 | Chen |
| 2020/0395328 A1 * | 12/2020 | Fastow ................... H01L 24/32 |

\* cited by examiner

SEMICONDUCTOR DEVICE FOR PREVENTING DEFECTS BETWEEN BIT LINES AND CHANNELS

CROSS-REFERENCE TO RELATED APPLICATION

This application claims benefit of priority to Korean Patent Application No. 10-2019-0057920 filed on May 17, 2019 in the Korean Intellectual Property Office, the disclosure of which is incorporated herein by reference in its entirety.

BACKGROUND

The present inventive concepts relate to a semiconductor device.

Semiconductor devices may be manufactured to process large amounts of data while having decreased volumes. In order to manufacture semiconductor devices capable of processing large amounts of data, while decreasing overall volume of the semiconductor device, the degree of integration of the semiconductor elements constituting the semiconductor device may be increased. Accordingly, as one method for improving the degree of integration of a semiconductor device, a semiconductor device having a vertical transistor structure, instead of a conventional planar transistor structure, has been proposed. Such semiconductor devices may include a center-bit line structure sharing a bit line between vertically stacked upper and lower memory cell strings. However, as the size of the bit line decreases, it may be difficult to align the channel to the bit line.

SUMMARY

Some example embodiments of the present inventive concepts provide a semiconductor device having an improved degree of integration, and reliability.

According to some example embodiments of the present inventive concepts, a semiconductor device includes a first semiconductor structure including a substrate, and a circuit element on the substrate; and a second semiconductor structure connected to the first semiconductor structure, the second semiconductor structure including a base layer, a first memory cell structure including first gate electrodes on a first surface of the base layer, spaced apart from one another in a direction perpendicular to the first surface of the base layer, first channel structures passing through a portion of the first gate electrodes, and first string select channel structures connected to the first channel structures at one end of the first channel structures, the first string select channel structures passing through a portion of the first gate electrodes; a second memory cell structure including second gate electrodes vertically overlapping the first gate electrodes and spaced apart from each other in the direction perpendicular to the first surface of the base layer, second channel structures passing through a portion of the second gate electrodes, second string select channel structures connected to the second channel structures at one end of the second channel structures, the second string select channel structures passing through a portion of the second gate electrodes, and connection regions between the second channel structures and the second string select channel structures, the connection regions having a width wider than a width of each of the second channel structures and a width of each of the second string select channel structures; and common bit lines between the first memory cell structure and the second memory cell structure, the common bit lines electrically connected to the first and second string select channel structures in common, wherein the first memory cell structure further includes first channel pads between the common bit lines and the first string select channel structures, and the second memory cell structure further includes second channel pads along the common bit lines on first surfaces of the common bit lines facing the second memory cell structure.

According to some example embodiments of the present inventive concepts, a semiconductor device includes a base layer; first gate electrodes on a first surface of the base layer, spaced apart from one another in a direction perpendicular to the first surface of the base layer; first channel structures passing through at least a portion of the first gate electrodes, and including first channel layers; second gate electrodes on one side of the first gate electrodes and spaced apart from each other in a direction perpendicular to the first surface of the base layer; second channel structures passing through at least a portion of the second gate electrodes, and including second channel layers; common bit lines between the first gate electrodes and the second gate electrodes and electrically connected to the first and second channel layers in common; first channel pads between one end of the first channel structures and a first surface of the common bit lines; and second channel pads along the common bit lines on second surfaces of the common bit lines, opposite to the first surface of the common bit lines.

According to some example embodiments of the present inventive concepts, a semiconductor device includes a first semiconductor structure including a substrate and a circuit element on the substrate; and a second semiconductor structure on the first semiconductor structure, wherein the second semiconductor structure includes a base layer; a first memory cell structure including first gate electrodes on a first surface of the base layer, spaced apart from each other in a direction perpendicular to the first surface of the base layer; first channel structures passing through a portion of the first gate electrodes; first string select channel structures connected to the first channel structures at one end of the first channel structures, the first string select channel structures passing through a portion of the first gate electrodes; and first channel pads at one end of the first string select channel structures; a second memory cell structure comprising second gate electrodes vertically overlapping the first gate electrodes and spaced apart from each other in a direction perpendicular to the first surface of the base layer; second channel structures passing through a portion of the second gate electrodes; second string select channel structures connected to the second channel structures at one end of the second channel structures, the second string select channel structures passing through a portion of the second gate electrodes; and second channel pads at one end of the second string select channel structures; and common bit lines between the first memory cell structure, the common bit lines electrically connected to the first and second channel structures in common, wherein the first and second channel pads are arranged asymmetrically with respect to each other, based on the common bit lines.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Figure 1:
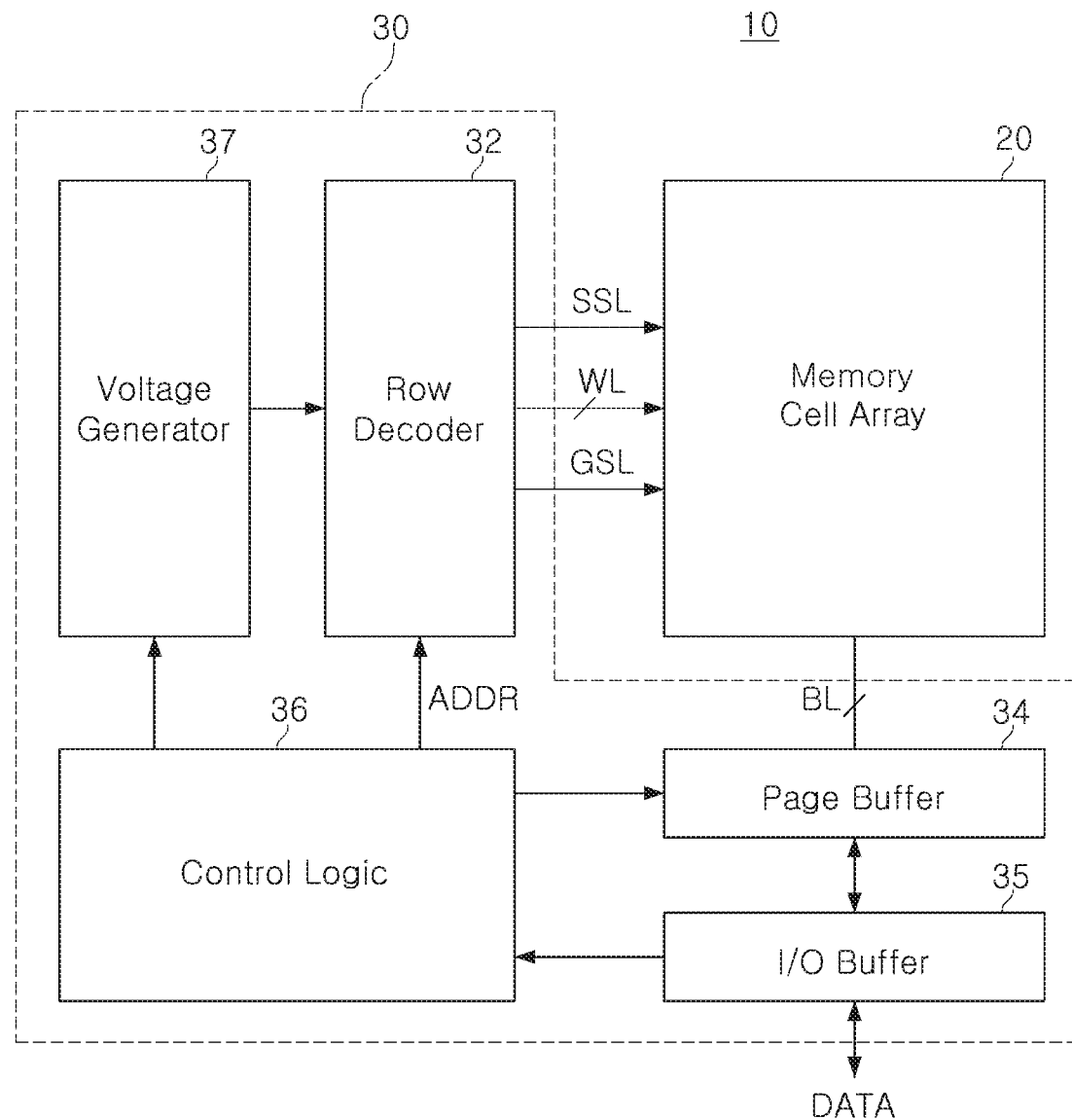
FIG. 1 is a schematic block diagram of a semiconductor device according to some example embodiments.

Hereinafter, some example embodiments of the present inventive concepts will be described with reference to the accompanying drawings. In the following description, terms such as "upper," "upper portion," "upper surface," "lower," "lower portion," "lower surface," "side surface," and the like can be to be understood as referring to the drawings.

FIG. 1 is a schematic block diagram of a semiconductor device according to some example embodiments.

Referring to FIG. 1, a semiconductor device 10 may include a memory cell array 20 and/or a peripheral circuit 30. The peripheral circuit 30 may include a row decoder 32, a page buffer 34, an input/output (I/O) buffer 35, a control logic 36, and/or a voltage generator 37.

The memory cell array 20 may include a plurality of memory blocks, and each memory block may include a plurality of memory cells. The plurality of memory cells may be connected to the row decoder 32 via a string select line SSL, word lines WL, and a ground select line GSL, and may be connected to the page buffer 34 via bit lines BL. In some example embodiments, the plurality of memory cells arranged on the same row may be connected to the same word line WL, and the plurality of memory cells arranged in the same column may be connected to the same bit line BL.

The row decoder 32 may decode an input address ADDR to generate and transfer driving signals of the word line WL. The row decoder 32 may provide a word line voltage generated by the voltage generator 37 to a selected word line WL and an unselected word line WL, respectively, in response to a control of the control logic 36.

The page buffer 34 may be connected to the memory cell array 20 via bit lines BL to read information stored in the memory cells. The page buffer 34 may temporarily store data to be stored in the memory cells, or sense data stored in the memory cells, depending on an operation mode. The page buffer 34 may include a column decoder and/or a sense amplifier. The column decoder may selectively activate the bit lines BL of the memory cell array 20. The sense amplifier may sense a voltage of the bit line BL selected by the column decoder during a reading operation, to read the data stored in the memory cell.

The input/output buffer 35 may receive data DATA, transfer the data DATA to the page buffer 34 in a program operation, and output data DATA transferred from the page buffer 34 externally in a reading operation. The input/output buffer 35 may transfer an address or a command to be input to the control logic 36.

The control logic 36 may control operations of the row decoder 32 and/or the page buffer 34. The control logic 36 may receive a control signal and an external voltage transferred from an external source, and may operate according to the received control signal. The control logic 36 may control a reading operation, a writing operation, and/or an erasing operation in response to the control signals.

The voltage generator 37 may use an external voltage to generate voltages for internal operations, for example, a programming voltage, a reading voltage, an erasing voltage, and the like. A voltage generated by the voltage generator 37 may be transferred to the memory cell array 20 via the row decoder 32.

Figure 2:
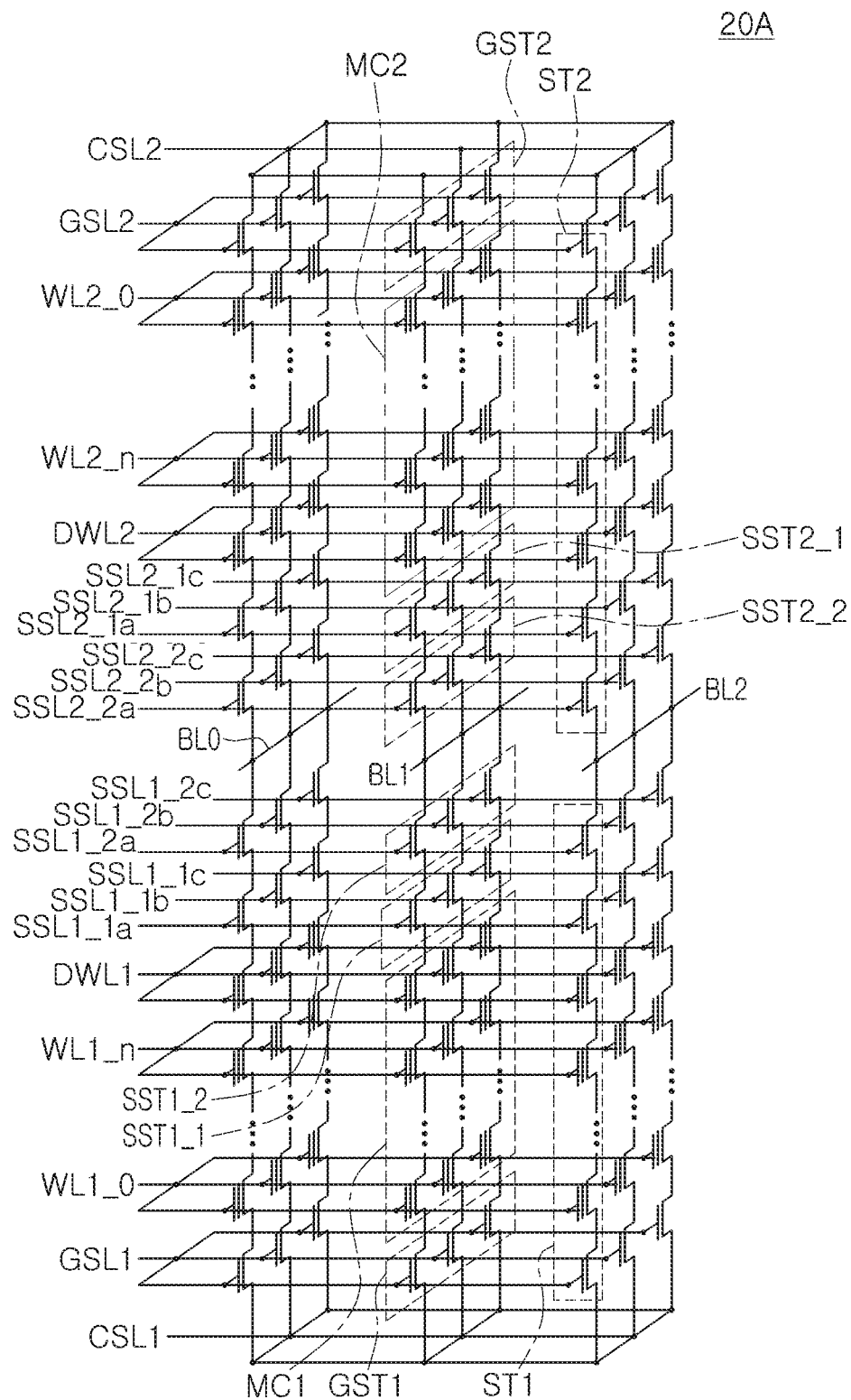
FIG. 2 is an equivalent circuit diagram of a cell array of a semiconductor device according to some example embodiments.

FIG. 2 is an equivalent circuit diagram of a cell array of a semiconductor device according to some example embodiments.

Referring to FIG. 2, a memory cell array 20A may include a plurality of first memory cell strings ST1, and the plurality of first memory cell strings ST1 may include first memory cells MC1 connected to each other in series, and/or a first ground select transistor GST1, and/or first string select transistors SST1_1 and SST1_2, connected to both ends of the first memory cells MC1 in series. The plurality of first memory cell strings ST1 may be respectively connected to common bit lines BL0 to BL2 in parallel. The plurality of first memory cell strings ST1 may be connected to a first common source line CSL1 in common. For example, the plurality of first memory cell strings ST1 may be disposed between the plurality of common bit lines BL0 to BL2 and the first common source line CSL1. In some example embodiments, the first common source line CSL1 may be arranged two-dimensionally as a plurality of first common source lines CSL1.

The memory cell array 20A may further include a plurality of second memory cell strings ST2 disposed on the common bit lines BL0 to BL2, and the plurality of second memory cell strings ST2 may include second memory cells MC2 connected to each other in series, and/or a second ground select transistor GST2, and/or second string select transistors SST2_1 and SST2_2, connected to both ends of the second memory cells MC2 in series. The plurality of second memory cell strings ST2 may be respectively connected to the common bit lines BL0 to BL2 in parallel. The plurality of second memory cell strings ST2 may be connected to a second common source line CSL2 in common. For example, the plurality of second memory cell strings ST2 may be disposed between the plurality of common bit lines BL0 to BL2 and the second common source line CSL2.

The common bit lines BL0 to BL2 arranged in a central portion in the memory cell array 20A may be electrically connected to the first and second memory cell strings ST1 and ST2 in common on upper and lower sides of the common bit lines BL0 to BL2. The first and second memory cell strings ST1 and ST2 may have substantially the same circuit structure, with respect to the common bit lines BL0 to BL2. Hereinafter, a common description of the first and second memory cell strings ST1 and ST2 will be provided, without distinguishing between the first and second memory cell strings ST1 and ST2.

The memory cells MC1 and MC2, connected to each other in series, may be controlled by word lines WL1_0 to WL1_$n$ and WL2_0 to WL2_$n$ for selecting the memory cells MC1 and MC2. Each of the memory cell MC1 and MC2 may include a data storage element. Gate electrodes of the memory cells MC1 and MC2, arranged at substantially equal distances from the common source lines CSL1 and CSL2, may be connected to one of the word lines WL1_0 to WL1_$n$ and WL2_0 to WL2_$n$ in common, to be in an equipotential state. Alternatively, although the gate electrodes of the memory cells MC1 and MC2 are arranged at substantially equal distances from the common source lines CSL1 and CSL2, the gate electrodes arranged in different rows or columns may be independently controlled.

The ground select transistors GST1 and GST2 may be controlled by ground select lines GSL1 and GSL2, and may be connected to the common source lines CSL1 and CSL2. The string select transistors SST1_1, SST1_2, SST2_1, and SST2_2 may be controlled by string select lines SSL_1_1 (SSL1_1$a$-SSL1_1$c$), SSL1_2 (SSL1_2$a$-SSL1_2$c$), SSL2_1 (SSL2_1$a$-SSL2_1$c$), and SSL2_2 (SSL2_2$a$-SSL2_2$c$), and may be connected to the common bit lines BL0 to BL2. Although FIG. 2 illustrates that one of the ground select transistors GST1 and GST2 and two of the string select transistors SST1_1, SST1_2, SST2_1, and SST2_2 are connected to the plurality of memory cells MC1 and MC2 connected to each other in series, one of the string select transistors may be connected thereto, or the plurality of ground select transistors may be connected thereto. One or more dummy lines DWL1 and DWL2 or buffer lines may be further provided between uppermost word lines WL1_$n$ and WL2_$n$, among the word lines WL1_0 to WL1_$n$ and WL2_0 to WL2_$n$, and the string select lines SSL1_1, SSL1_2, SSL2_1, and SSL2_2. In some example embodiments, one or more dummy lines may be disposed between lowermost word lines WL1_0 and WL2_0 and the ground select lines GSL1 and GSL2. As used herein, the term "dummy" has the same or similar structure and shape as the other components, but may be used for the purpose of referring to a configuration that does not function substantially in a device.

When signals are applied to the string select transistors SST1_1, SST1_2, SST2_1, and/or SST2_2 through the string select lines SSL1_1, SSL1_2, SSL2_1, and/or SSL2_2, signals applied through the common bit lines BL0 to BL2 may be transmitted to the memory cells MC1 and MC2 connected in series to perform data reading and writing operations. Further, a predetermined (or alternately given) erasing voltage may be applied through a substrate, to perform an erasing operation for erasing data recorded in the memory cells MC1 and MC2. In some example embodiments, the memory cell array 20A may include at least one dummy memory cell string electrically isolated from the common bit lines BL0 to BL2.

Figure 3:
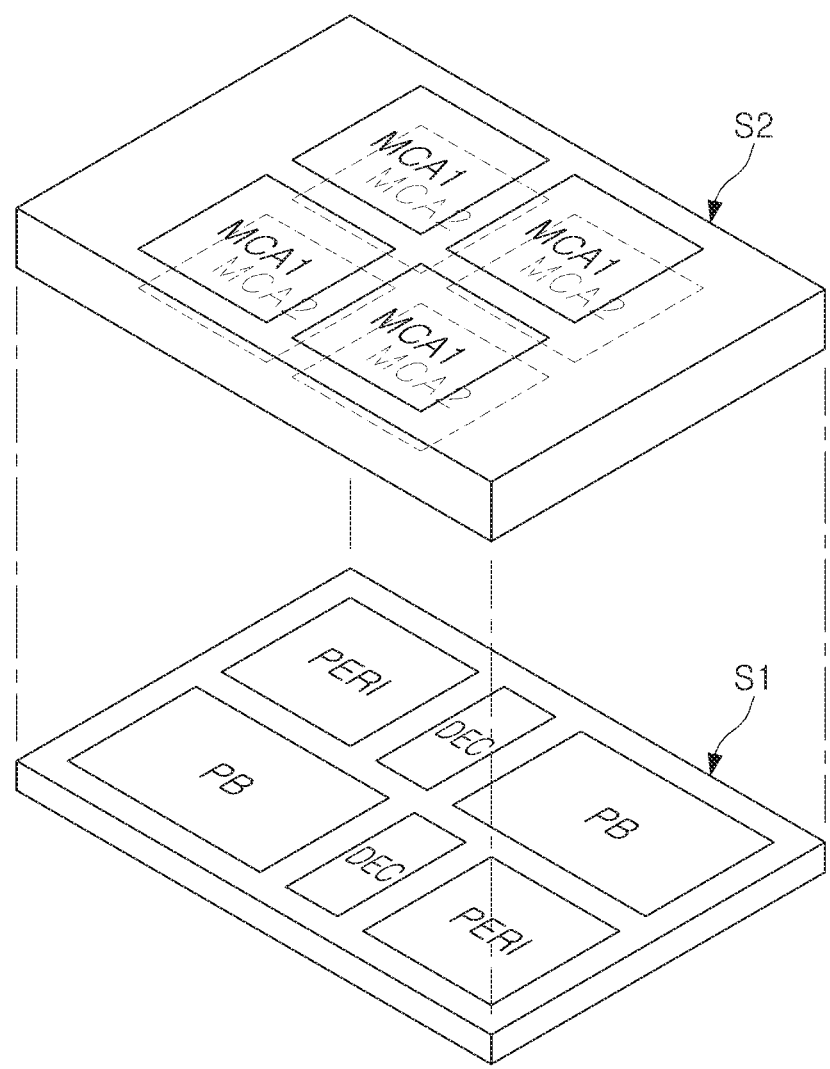
FIG. 3 is a schematic layout diagram illustrating arrangement of a semiconductor device according to some example embodiments.

FIG. 3 is a schematic layout diagram illustrating arrangement of a semiconductor device according to some example embodiments.

Referring to FIG. 3, a semiconductor device 10A may include a first semiconductor structure S1 and a second semiconductor structure S2, stacked in a vertical direction. The first semiconductor structure S1 may constitute the peripheral circuit 30 of FIG. 1, and the second semiconductor structure S2 may constitute the memory cell array 20 of FIG. 1.

The first semiconductor structure S1 may include a row decoder DEC, a page buffer PB, and/or other peripheral circuits PERI. The row decoder DEC may be a region corresponding to the row decoder 32 described above with reference to FIG. 1, and the page buffer PB may be a region corresponding to the page buffer 34 described above with reference to FIG. 1. The other peripheral circuit PERI may also be a region including the control logic 36 and/or the voltage generator 37 of FIG. 1, and may include a latch circuit, a cache circuit, and/or a sense amplifier. In addition, the other peripheral circuit PERI may include the input/output buffer 35 of FIG. 1, and may include an electrostatic discharge (ESD) element and/or a data input/output circuit. In some example embodiments, the input/output buffer 35 may be disposed to form a separate region around other peripheral circuits PERI.

At least a portion of the various circuit regions DEC, PB, and/or PERI in the first semiconductor structure S1 may be arranged under memory cell arrays MCA1 and MCA2 of the second semiconductor structure S2. For example, the page buffer PB and other peripheral circuits PERI may be arranged to overlap the memory cell arrays MCA1 and MCA2 below the memory cell arrays MCA1 and MCA2. In some example embodiments, circuits and arrangement included in the first semiconductor structure S1 may be variously changed. Therefore, circuits overlapping with the memory cell arrays MCA1 and MCA2 may be also variously changed. In some example embodiments, the circuit regions DEC, PB, and/or PERI may be formed in such a manner that the arrangement illustrated in FIG. 3 is repeatedly set, depending on the number and size of the memory cell arrays MCA1 and MCA2.

The second semiconductor structure S2 may include the memory cell arrays MCA1 and MCA2. Each of the memory cell arrays MCA1 and MCA2 may include first and second memory cell arrays MCA1 and MCA2, stacked in a vertical direction, and each of the first and second memory cell arrays MCA1 and MCA2 may be disposed to be spaced apart from each other on the same plane. In some example embodiments, the number, the number of layers, and the arrangement of the memory cell arrays MCA1 and MCA2 arranged in the second semiconductor structure S2 may be variously changed. According to some example embodiments, pad regions for transmitting and receiving an electrical signal to or from an external device or the like may be further disposed on at least one side of the memory cell arrays MCA1 and MCA2. The pad regions may be regions electrically connected to an input/output circuit corresponding to, for example, the input/output buffer 35 of FIG. 1, among circuits in other peripheral circuits PERI of the first semiconductor structure S1, in the semiconductor device 10A.

Figure 4:
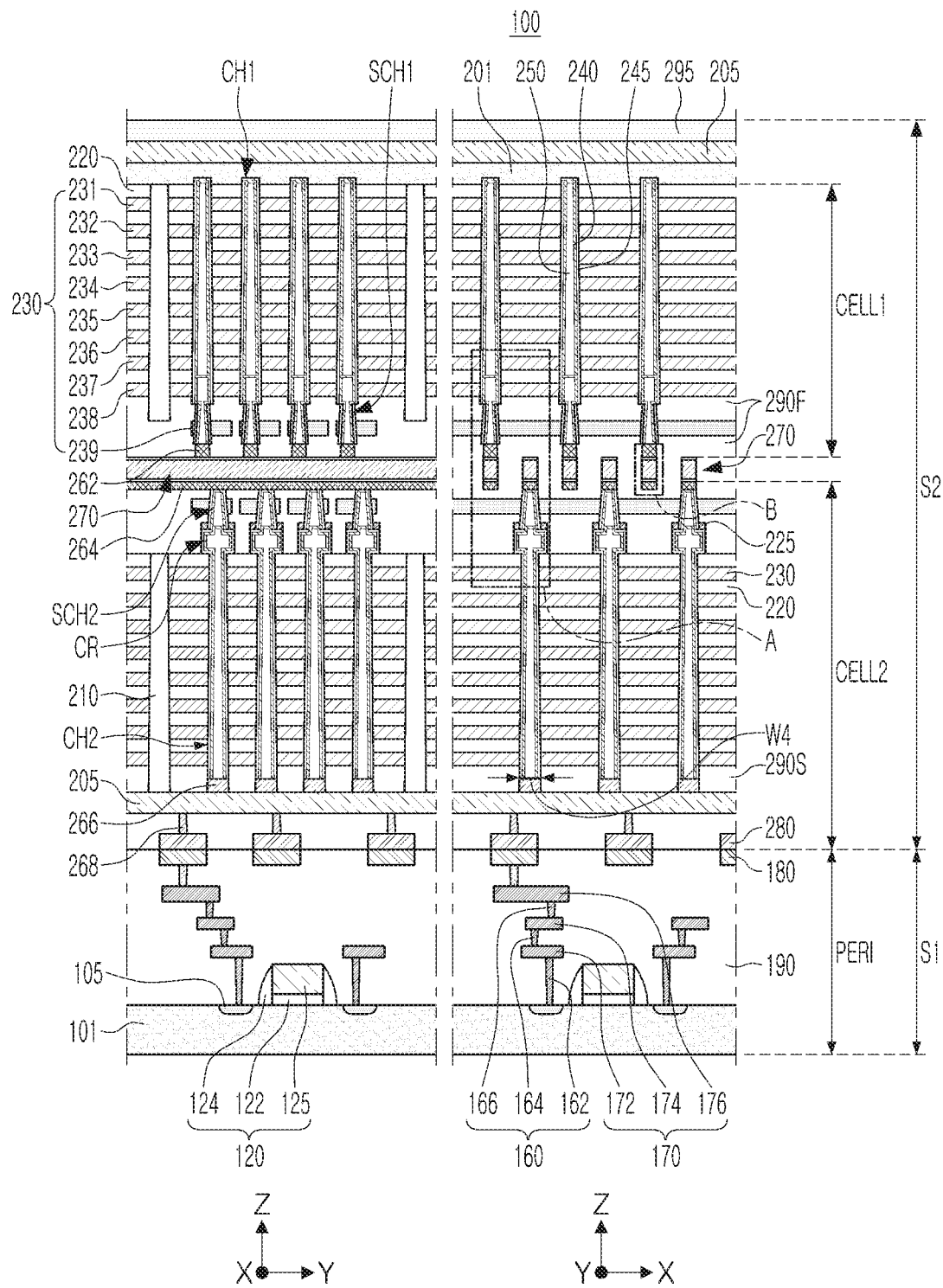
FIG. 4 is a schematic cross-sectional view of a semiconductor device according to some example embodiments.

FIG. 4 is a schematic cross-sectional view of a semiconductor device according to some example embodiments. FIG. 4 illustrates cross-sections in two directions perpendicular to each other.

Figure 5:
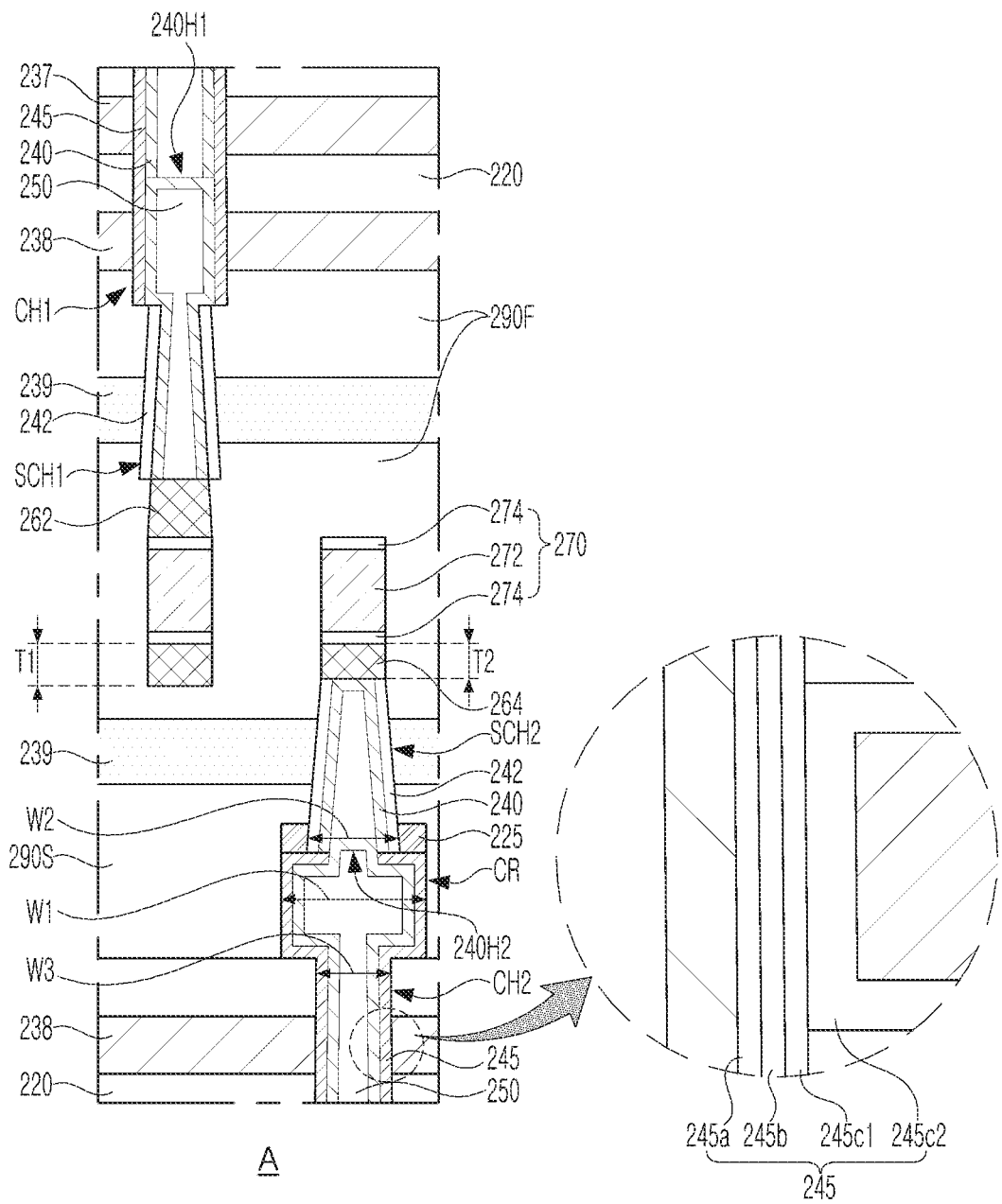
FIG. 5 is a schematic partially enlarged view of a semiconductor device according to some example embodiments.

FIG. 5 is a schematic partially enlarged view of a semiconductor device according to some example embodiments. FIG. 5 illustrates an enlarged view of region 'A' of FIG. 4.

Referring to FIGS. 4 and 5, a semiconductor device 100 may include a first semiconductor structure S1 and a second semiconductor structure S2, stacked in a vertical direction. The first semiconductor structure S1 may include a peripheral circuit region PERI, in a similar manner to the first semiconductor structure S1 of FIG. 3. The second semiconductor structure S2 may include first and second memory cell regions CELL1 and CELL2, in a similar manner to the second semiconductor structure S2 of FIG. 3.

The first semiconductor structure S1 may include a substrate 101, circuit elements 120 disposed on the substrate 101, circuit contact plugs 160, circuit wiring lines 170, and/or first bonding pads 180.

The substrate 101 may have an upper surface extending in x and y directions. Separate element separation layers may be formed on the substrate 101 to define an active region. Source/drain regions 105 containing impurities may be disposed in a portion of the active region. The substrate 101 may include a semiconductor material, such as a Group IV semiconductor, a Group III-V compound semiconductor, or a Group II-VI compound semiconductor. For example, the substrate 101 may be provided as a single crystal bulk wafer.

The circuit elements 120 may include a planar transistor. Each of the circuit elements 120 may include a circuit gate dielectric layer 122, a spacer layer 124, and/or a circuit gate electrode 125. The source/drain regions 105 may be disposed in the substrate 101 on both side of the circuit gate electrode 125.

A peripheral region insulation layer 190 may be disposed on the circuit element 120 and/or on the substrate 101. The circuit contact plugs 160 may be connected to the source/drain regions 105 through the peripheral region insulation layer 190, and may include first to third circuit contact plugs 162, 164, and 166, sequentially located on and from the substrate 101. An electrical signal may be applied to the circuit elements 120 by the circuit contact plugs 160. In a region not illustrated herein, the circuit contact plugs 160 may also be connected to the circuit gate electrode 125. The circuit wiring lines 170 may be connected to the circuit contact plugs 160, and may include first to third circuit wiring lines 172, 174, and 176 forming a plurality of layers.

The first bonding pads 180 may be disposed to be connected to the third circuit contact plugs 166, to be exposed to the upper surface of the first semiconductor structure S1 through the peripheral region insulation layer 190. The first bonding pads 180 together with second bonding pads 280 may serve as a bonding layer for bonding between the first semiconductor structure S1 and the second semiconductor structure S2. The first bonding pads 180 may have a larger planar area than the other wiring structures, to provide bonding with the second semiconductor structure S2 and an electrical connecting path. The first bonding pads 180 may be located at a position corresponding to the second bonding pads 280, and may have the same or similar size as the second bonding pads 280. The first bonding pads 180 may include a conductive material, for example, copper (Cu).

The second semiconductor structure S2 may include a base layer 201, and the first and second memory cell regions CELL1 and CELL2, stacked on the base layer 201 in a vertical direction, with common bit lines 270 interposed therebetween.

The first memory cell region CELL1 may include gate electrodes 230 (231-239), stacked on a lower surface of the base layer 201, interlayer insulation layers 220 alternately stacked with the gate electrodes 230, a separation insulation layer 210 disposed to pass through the gate electrodes 230, first channel structures CH1 disposed to pass through the gate electrodes 230, first string select channel structures SCH1 disposed below the first channel structures CH1, first channel pads 262 disposed below the string select channel structures SCH1, and/or a first cell region insulation layer 290F covering the gate electrodes 230. The first memory cell region CELL1 may further include a source layer 205 and an outermost insulation layer 295, arranged on an upper surface of the base layer 201. The first memory cell region CELL1 also may further include channel layers 240 and channel embedded insulation layers 250 in the first channel structures CH1 and the first string select channel structures SCH1, gate insulation layers 242 in the first string select channel structures SCH1, and/or gate dielectric layers 245 in the first channel structures CH1.

The second memory cell region CELL2 may include second channel pads 264 on a lower surface of the common bit lines 270, second string select channel structures SCH2 disposed below the second channel pads 264, connection regions CR disposed below the second string select channel structures SCH2, second channel structures CH2 disposed below the connection regions CR, third channel pads 266 disposed below the second channel structures CH2, source layer 205 disposed below the third channel pads 266, connection portions 268 disposed below the source layer 205, and/or second bonding pads 280 connected to the connection portions 268. Similarly to the first memory cell region CELL1, the second memory cell region CELL2 may further include gate electrodes 230 surrounding the second channel structures CH2 and stacked to be spaced apart from each other in the z direction, interlayer insulation layers 220, a separation insulation layer 210 disposed to pass through the gate electrodes 230, and/or a second cell region insulation layer 290S covering the gate electrodes 230. The second memory cell region CELL2 also may further include channel layers 240 and/or channel embedded insulation layers 250 in the second channel structures CH2 and the second string select channel structures SCH2, gate insulation layers 242 in the second string select channel structures SCH2, and/or gate dielectric layers 245 in the second channel structures CH2.

The base layer 201 may have a lower surface extending in the x and y directions. The base layer 201 may include a semiconductor material. For example, the base layer 201 may be provided as a polycrystalline silicon layer, or as an epitaxial layer. The base layer 201 may include at least one doped region containing impurities.

The gate electrodes 230 may be vertically stacked to be spaced apart from each other on the lower surface of the base layer 201 in the first and second memory cell regions CELL1 and CELL2, to form a stacked structure together with the interlayer insulation layers 220. The gate electrodes 230 may include a lower gate electrode 231 constituting a gate of the ground select transistors GST1 and GST2 of FIG. 2, memory gate electrodes 232 to 238 constituting the plurality of memory cells MC, and/or an upper gate electrode 239 constituting gates of the string select transistors SST1 and SST2. The upper gate electrode 239 may be referred to as a string select gate electrode. The number of memory gate electrodes 232 to 238 forming the memory cells MC may be determined, depending on capacity of the semiconductor device 100. The upper gate electrodes 239 of the string select transistors SST1 and SST1, and/or the lower gate electrodes 231 of the ground select transistors GST1 and GST2 may be arranged by stacking one or two or more of each of them in a vertical direction. The ground select transistors GST1 and GST2 provided by the lower gate electrode 231 may have the same or different structure as the memory cells MC, and the string select transistors SST1 and SST2 provided by the upper gate electrodes 239 may have a different structure from the memory cells MC. At least a portion of the memory gate electrodes 232 to 238 adjacent to a portion of the gate electrodes 230, e.g., upper gate electrodes 239 or lower gate electrodes 231, may be dummy gate electrodes.

The gate electrodes 230 may be arranged to surround the channels CH1 and CH2, and, in particular, the upper gate electrodes 239 may be arranged to surround the string select channel structures SCH1 and SCH2. The gate electrodes 230, except for the upper gate electrodes 239, may be arranged to be separated in a certain unit by the separation insulation layers 210 extending in the x direction. The upper gate electrodes 239 may have a thickness thicker than the other gate electrodes 231 to 238, but is not limited thereto. The gate electrodes 230 may form a single memory block between a pair of the separation insulation layers 210 disposed adjacent to each other in the y direction, but the scope of the memory block is not limited thereto. A portion of the gate electrodes 230, for example, memory gate electrodes 232 to 238, may form a single layer in a single memory block. The upper gate electrodes 239 may be disposed to be divided into a plurality of string select channel structures SCH1 and SCH2 adjacent to each other in the y direction, in a different manner to the other gate electrodes 231 to 238.

The gate electrodes 230 may include a conductive material, for example, a metal material such as tungsten (W) or polycrystalline silicon. For example, the upper gate electrodes 239 may include polycrystalline silicon including n-type impurities, and the other gate electrodes 231 to 238 may include a metal material. The gate electrodes 230 may be vertically stacked on the lower surface of the base layer 201, and may extend at different lengths at one end in the x direction, to form a stepped region. In the stepped region, the gate electrodes 230 may be connected to separate contact plugs to be electrically connected to the circuit elements 120 of the peripheral circuit region PERI, respectively.

The interlayer insulation layers 220 may be disposed between the gate electrodes 230. In a similar manner to the gate electrodes 230, the interlayer insulation layers 220 may be also disposed to be spaced apart from each other in a direction perpendicular to the lower surface of the base layer 201, and to extend in the x direction. The interlayer insulation layers 220 may include an insulating material such as silicon oxide or silicon nitride.

The first and second channel structures CH1 and CH2 may be spaced apart from each other in rows and columns to pass through at least a portion of the gate electrodes 230 on the lower surface of the base layer 201. The first and second channel structures CH1 and CH2 may include a plurality of layers disposed in channel holes and extending in a direction perpendicular to the base layer 201, respectively. The first and second channel structures CH1 and CH2 may be arranged to form a lattice pattern, or may be arranged in a zigzag form in a single direction. The first and second channel structures CH1 and CH2 may have a columnar shape, and may have a sloped side surface that becomes narrower toward the base layer 201, depending on an aspect ratio. The first and second channel structures CH1 and CH2 each may have sloped side surfaces in the same direction. For example, the first and second channel structures CH1 and CH2 may all have sloped side surfaces to become narrower in an upward direction. In some example embodiments, a portion of the first and second channel structures CH1 and CH2 may be dummy channels.

The first and second string select channel structures SCH1 and SCH2 each may be arranged at one end of each of the first and second channel structures CH1 and CH2 facing the common bit lines 270, to be connected to the first and second channel structures CH1 and CH2, respectively. The first and second string select channel structures SCH1 and SCH2 may be arranged to pass through a portion of the gate electrodes 230, in particular, the upper gate electrodes 239. The first and second string select channel structures SCH1 and SCH2 may have a smaller diameter or narrower width than the first and second channel structures CH1 and CH2, respectively. In particular, the first string select channel structures SCH1 may have a smaller diameter or narrower width than the first channel structures CH1, at least in a region connected to at least the first channel structures CH1. As above, a bent portion may be formed between the first and second string select channel structures SCH1 and SCH2 and the first and second channel structures CH1 and CH2, respectively.

Since the first and second string select channel structures SCH1 and SCH2 are connected to the first and second channel structures CH1 and CH2, respectively, the first and second string select channel structures SCH1 and SCH2 may be arranged in the same pattern as the first and second channel structures CH1 and CH2. The first and second string select channel structures SCH1 and SCH2 may have sloped side surfaces that become narrower toward the base layer 201, depending on an aspect ratio. According to some example embodiments, the first and second string select channel structures SCH1 and SCH2 may have a side surface that may be substantially perpendicular to the lower surface of the base layer 201, respectively.

The connection regions CR may be arranged between the second channel structures CH2 and the second string select channel structures SCH2, to connect the second channel structures CH2 and the second string select channel structures SCH2. A first width W1 or diameter of the connection region CR may be wider than a second width W2 of the second string select channel structure SCH2 adjacent to the connection region CR and a third width W3 of the second channel structure CH2 adjacent to the connection region CR, as illustrated in FIG. 5. The first width W1 of the connection region CR may be wider than a fourth width W4, the maximum width at a lower end of the second channel structure CH2, as illustrated in FIG. 4. With such a structure, the connection regions CR may stably connect the second channel structures CH2 to the second string select channel structures SCH2 during the manufacturing process, regardless of the degree of slope of side surface of the second channel structures CH2.

The gate dielectric layer 245, the channel layer 240, and a channel embedded insulation layer 250, extending from the second channel structures CH2, may be arranged in the connection regions CR. An etch stop layer 225 may be disposed on an upper surface of the connection regions CR. The etch stop layer 225 may be used as a layer for etch stop in a process of forming the connection regions CR, and will be described in more detail below with reference to FIG. 13K. According to some example embodiments, a portion of the second cell region insulation layer 290S may be interposed between the upper surface of the connection regions CR and the etch stop layer 225.

The channel layers 240 may be disposed in the first and second channel structures CH1 and CH2, the first and second string select channel structures SCH1 and SCH2, and the connection regions CR. The channel layers 240 in the first and second channel structures CH1 and CH2 may be formed as an annular shape surrounding the channel embedded insulation layer 250 disposed therein, and may have a columnar shape such as a cylindrical shape or a prismatic shape, without the channel embedded insulation layer 250, according to some example embodiments. The channel layers 240 may include a semiconductor material, such as polycrystalline silicon and/or single crystalline silicon, and the semiconductor material may be undoped material, but is not limited thereto, and, according to some example embodiments, may include p-type or n-type impurities. The channel layers 240 may be connected to the first or second channel pads 262 and 264 at end portions adjacent to the common bit lines 270. The channel layers 240 may be connected to the base layer 201 or the third channel pads 266 at the other end portions not adjacent to the common bit lines 270.

The channel layers 240 may include a first horizontal portion 240H1 extending in the horizontal direction along the upper surface of the base layer 201 to intersect the first channel structures CH1, in a region of the first channel structures CH1 adjacent to the first string select channel structures SCH1. The channel layers 240 may also include a second horizontal portion 240H2 extending in parallel with the upper surface of the base layer 201 to intersect the second string select channel structures SCH2, in a region of the second string select channel structures SCH2 adjacent to the connection regions CR. The first and second horizontal portions 240H1 and 240H2 may be arranged to divide the channel embedded insulation layers 250 in a vertical direction, respectively.

The gate dielectric layers 245 may be disposed between the gate electrodes 230 and the channel layers 240, respectively. In a different manner to the channel layers 240, the gate dielectric layers 245 may be confined to the first and second channel structures CH1 and CH2 and the connection regions CR, and may not extend into the first and second string select channel structures SCH1 and SCH2. As illustrated in the enlarged view of FIG. 5, the gate dielectric layers 245 may include a tunneling layer 245a, an electric charge storage layer 245b, and/or blocking layers 245c1 and 245c2, sequentially stacked from the channel layers 240. The tunneling layer 245a may tunnel an electric charge into the electric charge storage layer 245b, and may include, for example, silicon oxide ($SiO_2$), silicon nitride ($Si_3N_4$), silicon oxynitride (SiON), or combinations thereof. The electric charge storage layer 245b may be an electric charge trap layer or a floating gate conductive layer. The blocking layers 245c1 and 245c2 may include silicon oxide ($SiO_2$), silicon nitride ($Si_3N_4$), silicon oxynitride (SiON), a high-k dielectric material, or combinations thereof. An outer blocking layer 245c2 may extend in the horizontal direction along the gate electrodes 230. In some example embodiments, the blocking layers 245c1 and 245c2 may be disposed to extend in the horizontal direction along the gate electrodes 230, or may be disposed to extend vertically in the first and second channel structures CH1 and CH2.

The gate insulation layers 242 may be disposed between the upper gate electrodes 239 and the channel layers 240 in the first and second string select channel structures SCH1 and SCH2, respectively. The gate insulation layers 242 may include, for example, silicon oxide ($SiO_2$), silicon nitride ($Si_3N_4$), silicon oxynitride (SiON), or combinations thereof. According to some example embodiments, the gate insulation layers 242 may have a shape extending from a portion of the gate dielectric layers 245, and may be made of the same material as that of a portion of the gate dielectric layer 245. In some example embodiments, the gate insulation layer 242 may be a layer including the same material as that of the tunneling layer 245a of the gate dielectric layers 245, or may be made of a stacked structure of layers including the same material as materials of the tunneling layer 245a and an inner blocking layer 245c1.

The channel embedded insulation layers 250 may be disposed to fill an inner portion of the channel layers 240 in the first and second channel structures CH1 and CH2, the first and second string select channel structures SCH1 and SCH2, and the connection regions CR. The channel embedded insulation layers 250 may include, for example, silicon oxide ($SiO_2$), silicon nitride ($Si_3N_4$), silicon oxynitride (SiON), or combinations thereof.

The first and second channel pads 262 and 264 may be disposed to be respectively connected to the end portions of the channel layer 240 of the first and second string select channel structures SCH1 and SCH2, adjacent to the common bit lines 270. The first and second channel pads 262 and 264 may be disposed asymmetrically with respect to each other, based on the common bit lines 270. The first channel pads 262 may be disposed on the upper surface of the common bit lines 270, and may only be disposed between the common bit lines 270 and the first string select channel structures SCH1. The second channel pads 264 may be disposed on the entirety of the lower surface of the common bit lines 270, and may be disposed to extend along the common bit lines 270. The first and second channel pads 262 and 264 may include a semiconductor material such as silicon, for example n-type doped polycrystalline silicon.

The first channel pads 262 may have a shape extending from the first string select channel structures SCH1, or a shape extending from the channel layers 240 of the first string select channel structures SCH1. Therefore, the first channel pads 262 may have widths continuously extending from outer walls of the channel layers 240. Each of the first channel pads 262 may have substantially the same width as a width of the channel layer 240 which may be a diameter defined by the outer wall of the channel layer 240 in the first string select channel structure SCH1, at an interface between the first channel pads 262 and the first string select channel structure SCH1. For example, when the channel layers 240 have sloped side surfaces, side surfaces of the first channel pads 262 may also have substantially the same slope angle. The first channel pads 262 may be disposed to cover a lower surface of the channel layers 240 and a lower surface of the channel embedded insulation layers 250 of the first string select channel structures SCH1.

The second channel pads 264 may have a shape extending along the common bit lines 270, and may be disposed between the common bit lines 270 and the second string select channel structures SCH2. As illustrated in FIG. 5, the second channel pads 264 may have a first thickness T1, and may have a second thickness T2 smaller than the first thickness T1 in a region in contact with the second string select channel structures SCH2. In some example embodiments, the second channel pads 264 may be further disposed in regions between the common bit lines 270 along x direction. In this case, the second channel pads 264 disposed between the common bit lines 270 may have a linear shape extending in parallel with the common bit lines 270.

The common bit lines 270 may be disposed between the first and second channel pads 262 and 264, and between the first and second memory cell regions CELL1 and CELL2. The common bit lines 270 may be connected to the first and second channel structures CH1 and CH2 and the first and second string select channel structures SCH1 and SCH2 in common, and may correspond to the bit lines BL0 to BL2, as illustrated in FIG. 2. The semiconductor device 100 may be integrated more densely due to the structure in which the first and second memory cell regions CELL1 and CELL2 share the common bit lines 270. The common bit lines 270 may include a conductive layer 272, and a barrier layer 274 covering at least one surface of the conductive layer 272. In this example embodiment, the barrier layers 274 may be disposed on upper and lower surfaces of the conductive layer 272, and may extend in the y-direction together with the conductive layer 272. The barrier layer 274 may be a diffusion prevention layer reducing or preventing a material of the conductive layer 272 from diffusing in an outward direction. The conductive layer 272 and the barrier layer 274 may be formed of a semiconductor material such as polycrystalline silicon, or a metal material such as tungsten (W), aluminum (Al), copper (Cu), tungsten nitride (WN), tantalum nitride (TaN), titanium nitride (TiN), or combinations thereof.

The source layers 205 may be disposed to overlap the first and second channel structures CH1 and CH2 in an upper portion of the first channel structures CH1 and in a lower portion of the second channel structures CH2, respectively. The source layers 205 may have a plate shape extending in an x-y plane, respectively, may apply an electrical signal to the first and second channel structures CH1 and CH2 in the semiconductor device 100, and may function as the common source lines CSL1 and CSL2, as illustrated in FIG. 2. The source layers 205 may include a semiconductor material or a metal material, and may be formed of a material such as tungsten (W), aluminum (Al), copper (Cu), tungsten nitride (WN), tantalum nitride (TaN), titanium nitride (TiN), or combinations thereof. The source layer 205 of the first memory cell region CELL1 may be electrically connected to the first channel structures CH1 through the base layer 201, and the source layer 205 of the second memory cell region CELL2 may be electrically connected to the second channel structures CH2 through third channel pads 266.

The third channel pads 266 may be disposed at the lower ends of the second channel structures CH2, and may include a semiconductor material or a conductive material such as a metal material. The connection portions 268 may be disposed between the second bonding pads 280 and the third channel pads 266, and may include conductive materials.

The second bonding pads 280 may be disposed below the connection portions 268, and lower surfaces of the second bonding pads 280 may be exposed from the lower surface of the second semiconductor structure S2 through the second cell region insulation layer 290S. The second bonding pads 280, together with the first bonding pads 180, may serve as a bonding layer for bonding the first semiconductor structure S1 and the second semiconductor structure S2. The second bonding pads 280 may have a larger planar area than the other wiring structures, to provide bonding with the first semiconductor structure S1 and an electrical connecting path. The second bonding pads 280 may have e.g., a rectangular, a circular, or an elliptical shape on a plane, and may be arranged in a uniform pattern. The second bonding pads 280 may include a conductive material, for example, copper (Cu).

The first and second cell region insulation layers 290F and 290S, and the outermost insulation layer 295 may be made of an insulating material, and may include at least one of, for example, silicon oxide, silicon nitride, and/or silicon carbide. The first and second cell region insulation layers 290F and 290S may include a plurality of layers formed in different processes, respectively. Therefore, the distinction between the first and second cell region insulation layers 290F and 290S can be understood as an example. In some example embodiments, the second cell region insulation layer 290S may include a bonding dielectric layer in a predetermined (or alternately given) thickness at the lower end at which the second bonding pad 280 is disposed. The bonding dielectric layer may be also disposed on the upper surface of the first semiconductor structure S1, such that dielectric-to-dielectric bonding may be achieved. The bonding dielectric layer may also function as a diffusion prevention layer of the second bonding pad 280, and may include at least one of, for example, SiO, SiN, SiCN, SiOC, SiON, and/or SiOCN.

The first and second semiconductor structures S1 and S2 may be bonded by bonding of the first and second bonding pads 180 and 280 such as copper-to-copper bonding. Since the first and second bonding pads 180 and 280 have a relatively larger area than the other structures of the wiring structure, the reliability of the electrical connection between the first and second semiconductor structures S1 and S2 may be improved. In some example embodiments, the first and second semiconductor structures S1 and S2 may be bonded by the bonding of the first and second bonding pads 180 and 280, and by hybrid bonding due to the dielectric-dielectric bonding of the peripheral region insulation layer 190 and the second cell region insulation layer 290S, surrounding the first and second bonding pads 180 and 280, respectively.

Figure 6A:
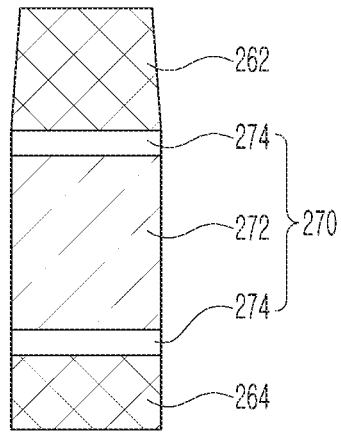
FIGS. 6A to 6C are schematic cross-sectional views of a partial configuration of a semiconductor device according to some example embodiments.
Figure 6B:
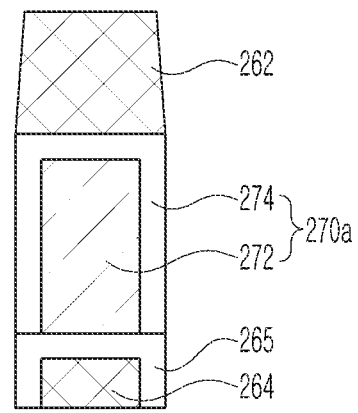
Figure 6C:
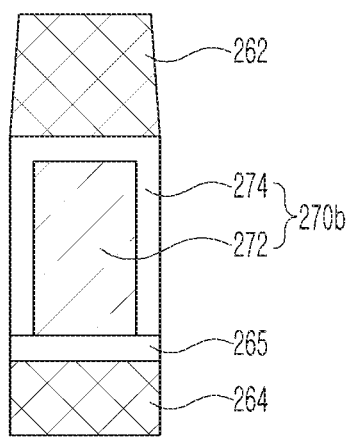

FIGS. 6A to 6C are schematic cross-sectional views of a partial configuration of a semiconductor device according to some example embodiments. FIGS. 6A to 6C illustrate an enlarged view corresponding to region 'B' of FIG. 4.

Referring to FIG. 6A, in common bit lines 270, a barrier layer 274 may be disposed on upper and lower surfaces of a conductive layer 272, and may extend together with the conductive layer 272.

Referring to FIG. 6B, in common bit lines 270a, a barrier layer 274 may be disposed on an upper surface of a conductive layer 272, e.g., on a surface facing a first channel pad 262, and on side surfaces of the conductive layer 272. In this example embodiment, a pad barrier layer 265 may be further disposed between the conductive layer 272 and a second channel pad 264. The pad barrier layer 265 may cover an upper surface and side surfaces of the second channel pad 264, and may extend together with the second channel pad 264. The pad barrier layer 265 may include a metal material such as, for example, tungsten nitride (WN), tantalum nitride (TaN), titanium nitride (TiN), or combinations thereof, and may include the same material as that of the barrier layer 274.

Referring to FIG. 6C, in common bit lines 270b, a barrier layer 274 may be disposed on an upper surface and side surfaces of a conductive layer 272, and may extend together with the conductive layer 272. In this example embodiment, a pad barrier layer 265 may be further disposed between the conductive layer 272 and a second channel pad 264. In a different manner to the example embodiments of FIG. 6B, the pad barrier layer 265 may cover only the upper surface of the second channel pad 264, and may extend together with the second channel pad 264.

The structures of the common bit lines 270, 270a, and 270b as illustrated in FIGS. 6A to 6C may be structures formed differently according to the manufacturing process.

Figure 7:
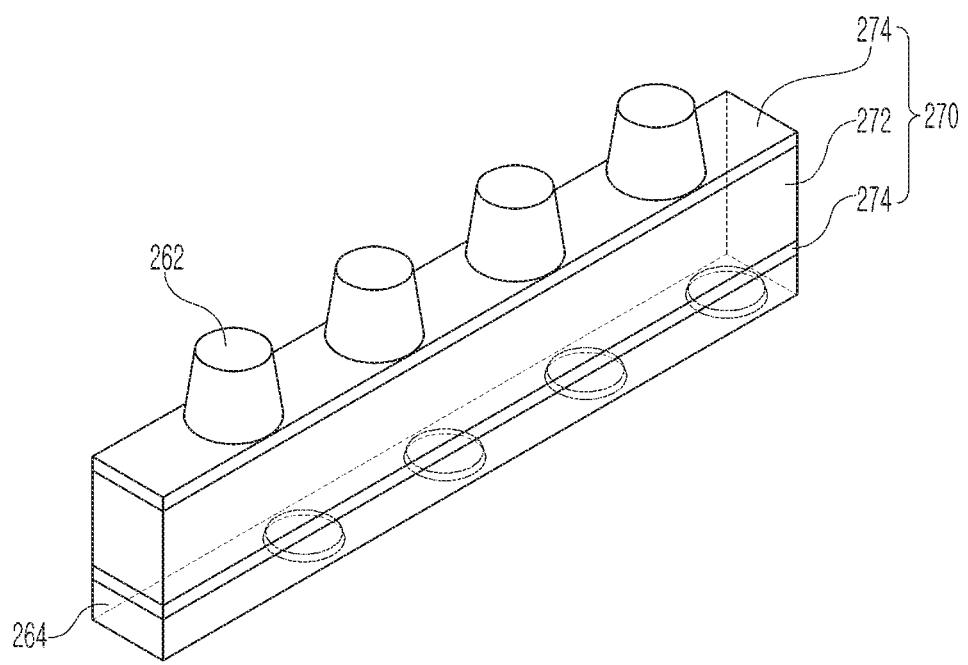
FIG. 7 is a schematic perspective view of a portion of a configuration of a semiconductor device according to some example embodiments.

FIG. 7 is a schematic perspective view of a portion of a configuration of a semiconductor device according to some example embodiments.

Referring to FIG. 7, a common bit line 270 and first and second channel pads 262 and 264 of a semiconductor device 100 are illustrated. The first channel pads 262 may only be formed on an upper surface of the common bit line 270 in regions connected to first string select channel structures SCH1. The first channel pads 262 may have a circular truncated cone shape, but is not limited thereto. The second channel pad 264 may extend along the common bit line 270 with substantially the same width as the common bit line 270 on a lower surface of the common bit line 270. The second channel pad 264 may be recessed to a predetermined (or alternately given) thickness from the lower surface to have a reduced thickness, in regions connected to second string select channel structures SCH2. For example, regions in which the second channel pad 264 is in contact with the second string select channel structures SCH2 each may have a circular shape on a plane. In some example embodiments, a shape of a lower surface of the second channel pad 264 is not limited thereto, and the second channel pad 264 may have a flat lower surface.

Figure 8:
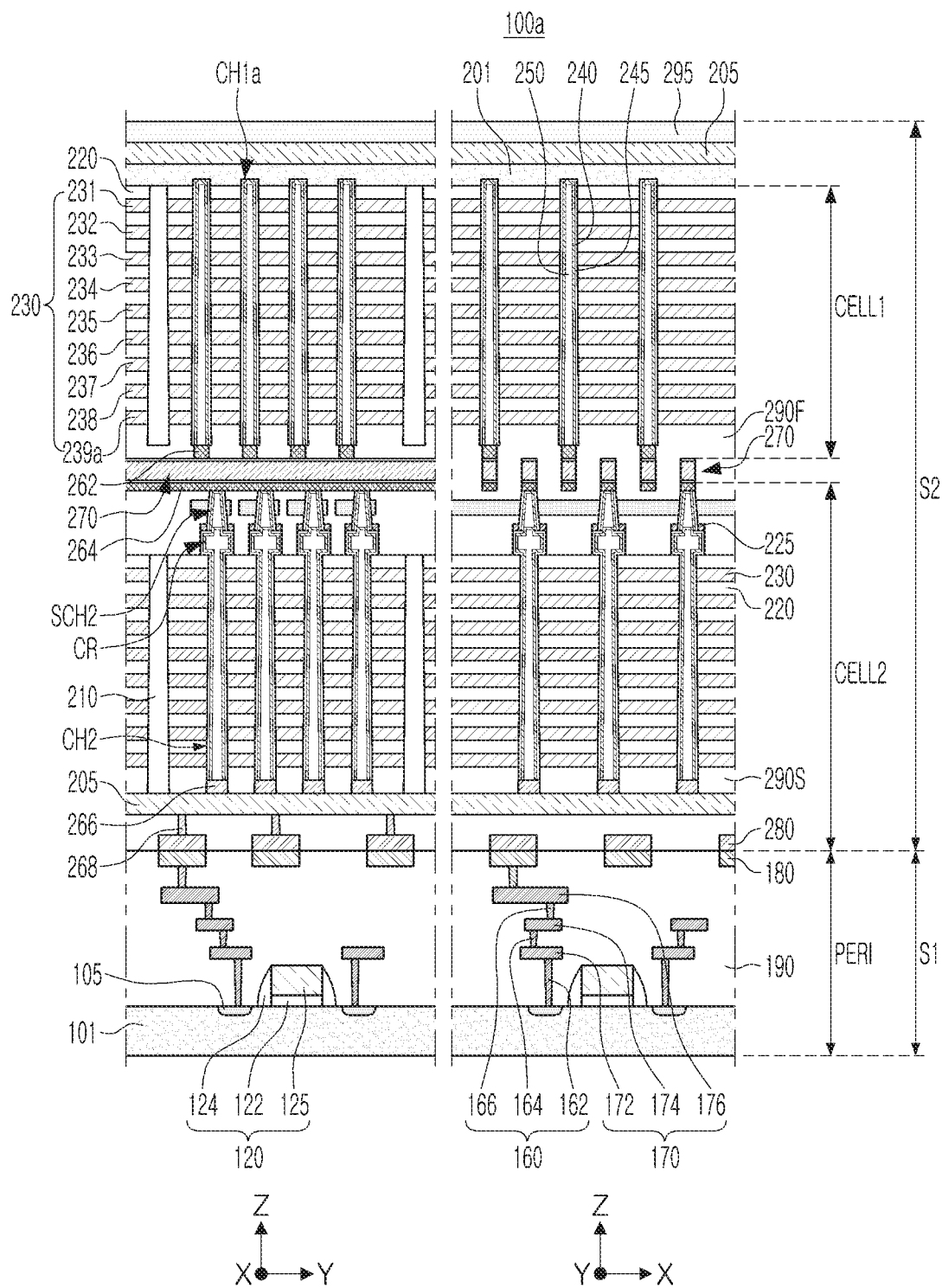
FIG. 8 is a schematic cross-sectional view of a semiconductor device according to some example embodiments.

FIG. 8 is a schematic cross-sectional view of a semiconductor device according to some example embodiments.

Referring to FIG. 8, in a semiconductor device 100a, a first memory cell region CELL1 may include gate electrodes 230, interlayer insulation layers 220, a separation insulation layer 210, first channel structures CH1a disposed to pass through the gate electrodes 230, first channel pads 262 disposed below the first channel structures CH1a, and/or a first cell region insulation layer 290F. In a different manner to the example embodiments of FIG. 4, the semiconductor device 100a may be arranged such that the first channel structures CH1a pass through the entirety of the gate electrodes 230. Further, first string select channel structures SCH1 passing through upper gate electrodes 239 may not be arranged separately.

In the first memory cell region CELL1, the upper gate electrodes 239a may be stacked on a lower surface of a base layer 201 at substantially the same thickness and spacing as other gate electrodes 231 to 238. According to some example embodiments, the upper gate electrodes 239a may be disposed at a relatively large thickness to be spaced apart from the other gate electrodes 231 to 238, in a similar manner to the example embodiments of FIG. 4.

Figure 9:
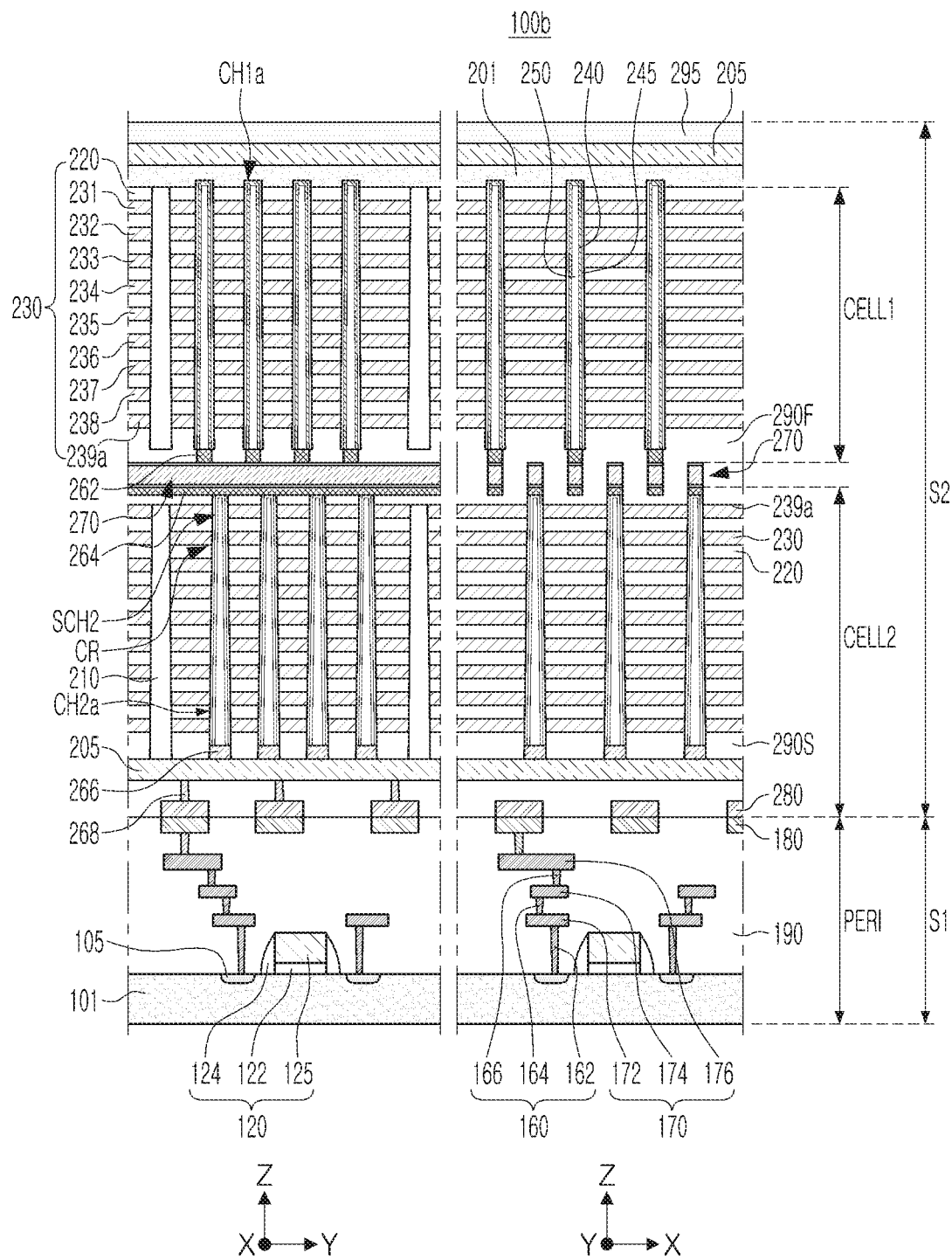
FIG. 9 is a schematic cross-sectional view of a semiconductor device according to some example embodiments.

FIG. 9 is a schematic cross-sectional view of a semiconductor device according to some example embodiments.

Referring to FIG. 9, in a semiconductor device 100b, a first memory cell region CELL1 may be formed such that, in a similar manner to the example embodiments of FIG. 8, first channel structures CH1a are disposed to pass through all gate electrodes 230, and first string select channel structures SCH1 passing through upper gate electrodes 239a are not disposed separately. A second memory cell region CELL2 may include gate electrodes 230, interlayer insulation layers 220, a separation insulation layer 210, second channel pads 264, second channel structures CH2a disposed below the second channel pads 264, third channel pads 266 disposed below the second channel structures CH2a, a source layer 205, connection portions 268, and/or second bonding pads 280. In a different manner to the example embodiments of FIG. 8, the semiconductor device 100b may be arranged such that the second channel structures CH2a pass through the entirety of the gate electrodes 230. Further, second string select channel structures SCH2 passing through upper gate electrodes 239a and connection regions CR may not be separately arranged.

In the first and second memory cell regions CELL1 and CELL2, the upper gate electrodes 239a may be stacked on a lower surface of a base layer 201 at substantially the same thickness and spacing as other gate electrodes 231 to 238. According to some example embodiments, the upper gate electrodes 239a may be arranged at a relatively large thickness to be spaced apart from the other gate electrodes 231 to 238, in a similar manner to the example embodiments of FIG. 4.

Figure 10:
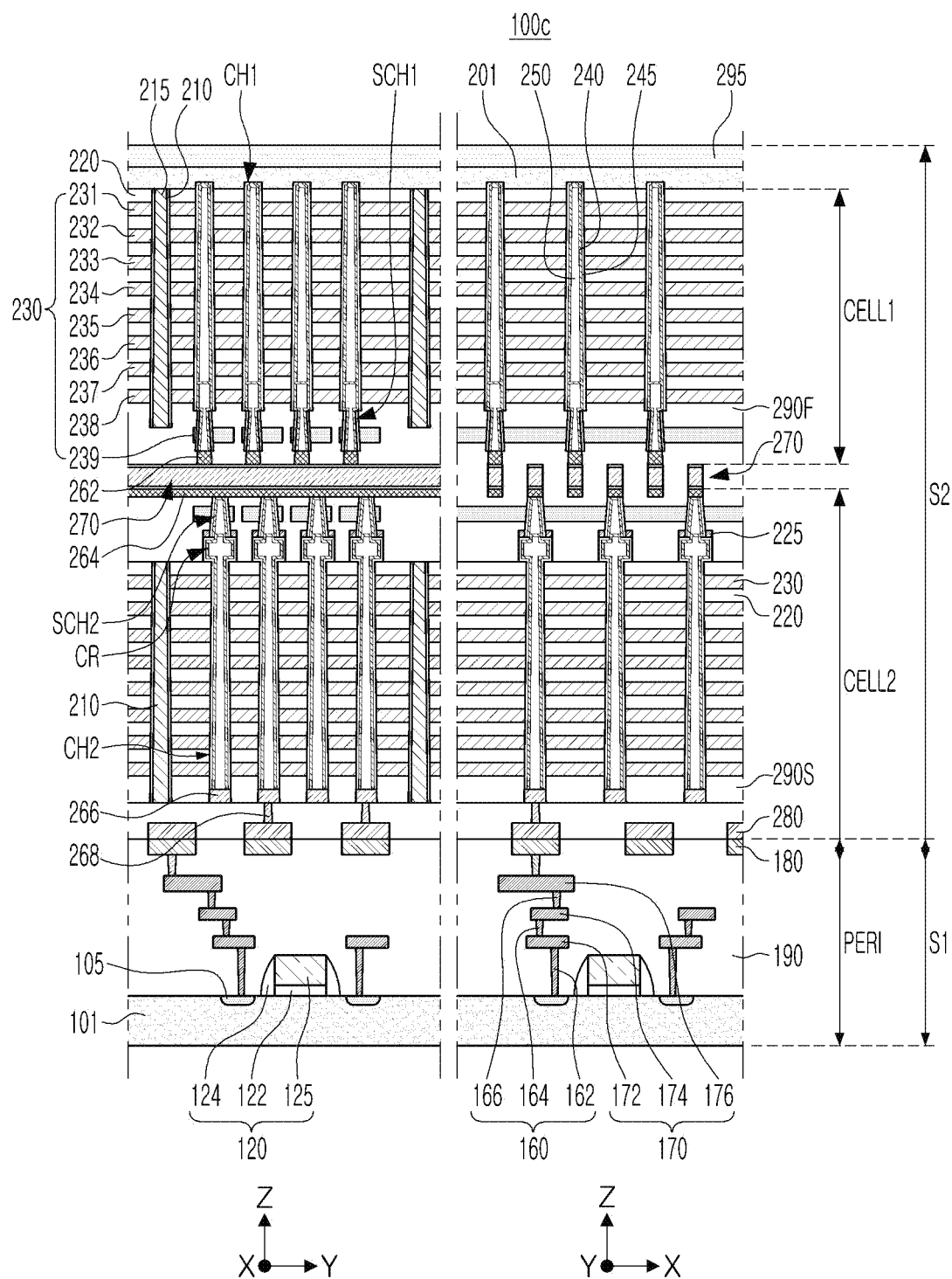
FIG. 10 is a schematic cross-sectional view of a semiconductor device according to some example embodiments.

FIG. 10 is a schematic cross-sectional view of a semiconductor device according to some example embodiments.

Referring to FIG. 10, in a semiconductor device 100c, a first memory cell region CELL1 may include gate electrodes 230, interlayer insulation layers 220, a separation insulation layer 210 disposed to pass through the gate electrodes 230, a source conductive layers 215 disposed in the separation insulation layers 210, first channel structures CH1, first string select channel structures SCH1, first channel pads 262, and/or a first cell region insulation layer 290F. A second memory cell region CELL2 may include gate electrodes 230, interlayer insulation layers 220, a separation insulation layer 210 disposed to pass through the gate electrodes 230, source conductive layers 215 disposed in the separation insulation layers 210, second channel pads 264, second string select channel structures SCH2, connection regions CR, second channel structures CH2, third channel pads 266, connection portions 268 connected to the third channel pads 266, and second bonding pads 280. In a different manner to the example embodiments of FIG. 4, the semiconductor device 100c may include the source conductive layers 215 disposed in the separation insulation layer 210, instead of the source layer 205 on the base layer 201 and the source layer 205 below the third channel pads 266.

The source conductive layers 215 may be insulated from the gate electrodes 230 by the separation insulation layer 210. The source conductive layers 215 may correspond to the common source lines CSL1 and CSL2 of FIG. 2 that apply an electrical signal to the first and second channel structures CH1 and CH2. In the second memory cell region CELL2, the third channel pads 266 may be disposed to be connected directly to the connection portions 268, since the source layer 205 below the third channel pads 266 is omitted.

Figure 11:
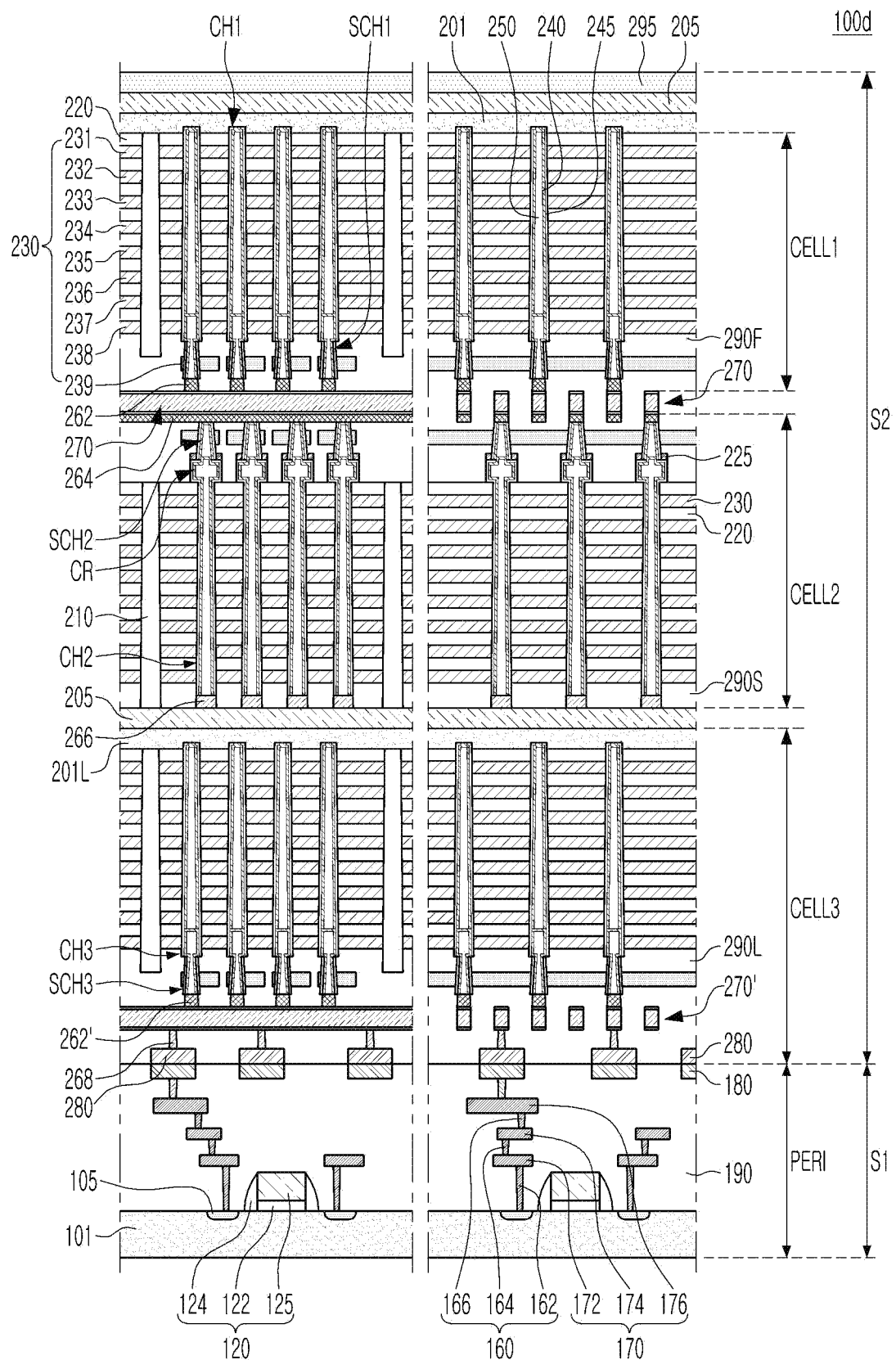
FIG. 11 is a schematic cross-sectional view of a semiconductor device according to some example embodiments.

FIG. 11 is a schematic cross-sectional view of a semiconductor device according to some example embodiments.

Referring to FIG. 11, in a semiconductor device 100d, a second semiconductor structure S2 may further include a third memory cell region CELL3. The third memory cell region CELL3 may be disposed below a second memory cell region CELL2. The third memory cell region CELL3 may include a lower substrate 201L on a lower surface of a source layer 205 of the second memory cell region CELL2, gate electrodes 230 on the lower substrate 201L, third channels CH3 disposed to pass through a portion of the gate electrodes 230, third string select channel structures SCH3 below the third channels CH3, second channel pads 262' below the third string select channel structures SCH3, bit lines 270' below the second channel pads 262', second bonding pads 280, and/or lower cell region insulation layers 290L covering the gate electrodes 230.

The third memory cell region CELL3 and the second memory cell region CELL2 thereon may have a structure sharing a common source line provided as the source layer 205. A lower portion of the third channels CH3 may be connected to separate bit lines 270', different from a common bit line 270 of first and second channel structures CH1 and CH2. As such, in some example embodiments, the number of memory cell regions disposed in the second semiconductor structure S2 may vary. When a plurality of memory cell regions are arranged, a bit line 270 or a source layer 205 may be shared between memory cell regions arranged adjacent to each other in a vertical direction.

Figure 12:
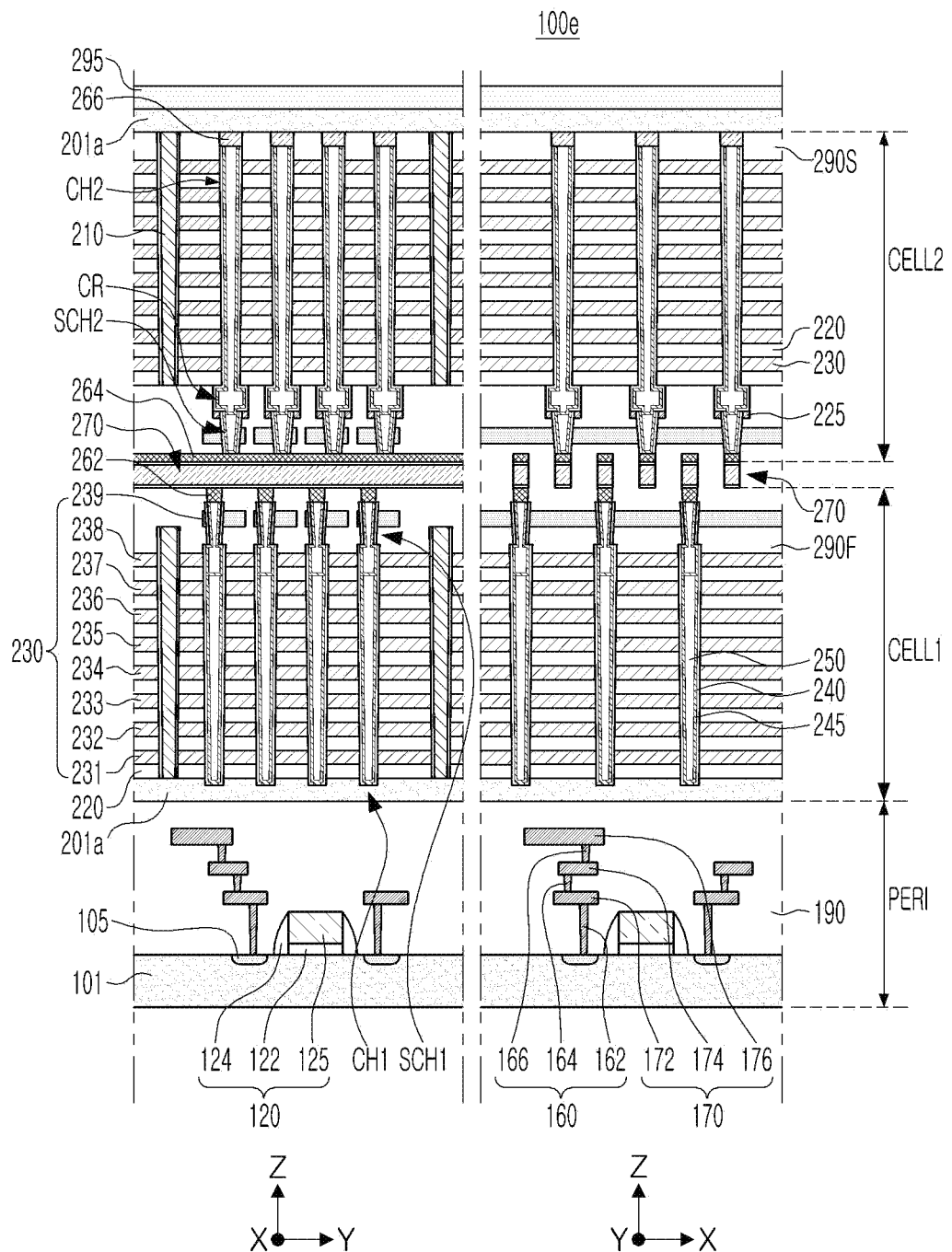
FIG. 12 is a schematic cross-sectional view of a semiconductor device according to some example embodiments.

FIG. 12 is a schematic cross-sectional view of a semiconductor device according to some example embodiments.

Referring to FIG. 12, a semiconductor device 100e may include a peripheral circuit region PERI on a substrate 101, and first and second memory cell regions CELL1 and CELL2 disposed on the peripheral circuit region PERI and between base layers 201a. The semiconductor device 100e may be formed of a single semiconductor structure, instead of a structure in which the two semiconductor structures S1 and S2 are bonded as illustrated in the example embodiments of FIG. 4. Therefore, the semiconductor device 100e may not include first and second bonding pads 180 and 280.

The first and second memory cell regions CELL1 and CELL2 may have a similar structure to the first and second memory cell regions CELL1 and CELL2 of FIG. 4. In particular, common bit lines 270 and first and second channel pads 262 and 264 may be the same as those of the semiconductor device 100 of FIG. 4 in view of their structures. In the semiconductor device 100e, the base layers 201a may be disposed on respective end portions of first and second channel structures CH1 and CH2 in a vertical direction. As illustrated in the example embodiments of FIG. 10, the semiconductor device 100e may include source conductive layers 215 disposed in a separation insulation layer 210, instead of a source layer 205 on the base layer 201a and a source layer 205 below third channel pads 266. In some example embodiments, instead of the source conductive layers 215, it is possible to arrange the source layers 205 in the same form as illustrated in the example embodiments of FIG. 4. Further, according to some example embodiments, in the first and second channel structures CH1 and CH2 of the semiconductor device 100e, epitaxial layers may be further disposed at a lower end connected to the base layer 201a.

Figure 13A:
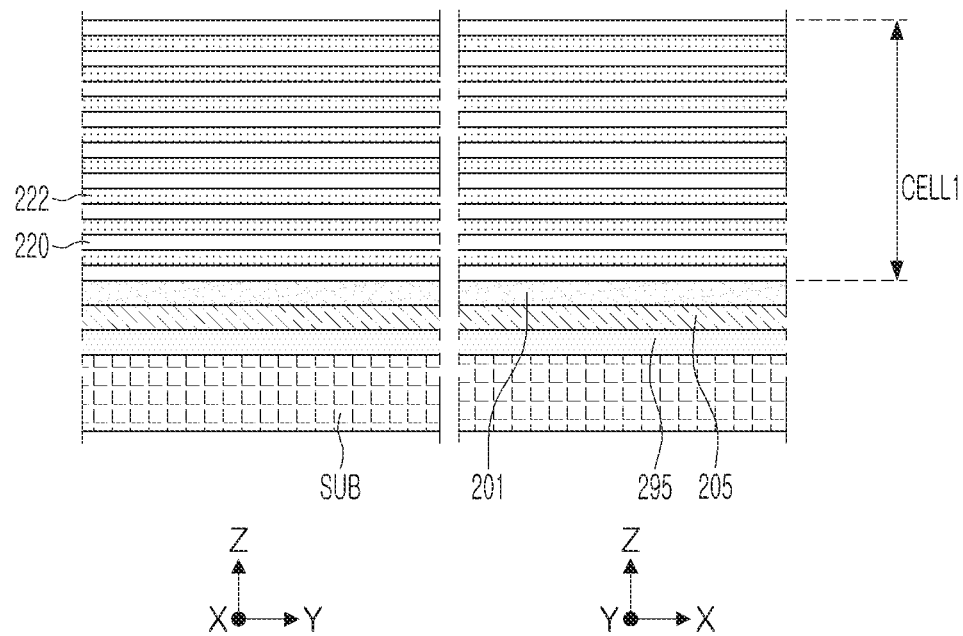
FIGS. 13A to 13P are schematic cross-sectional views illustrating a method of manufacturing a semiconductor device according to some example embodiments.
Figure 13B:
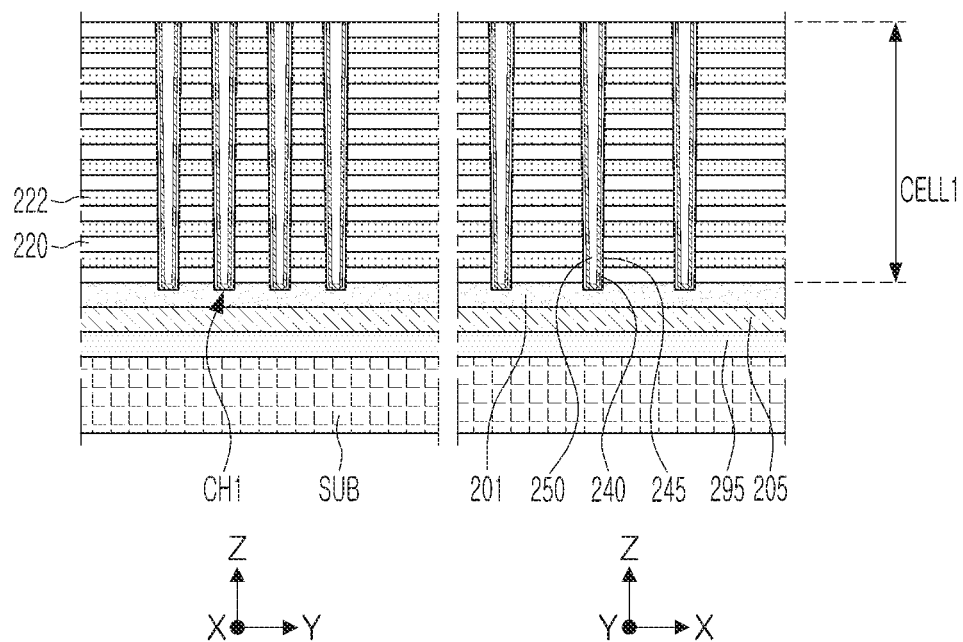
Figure 13C:
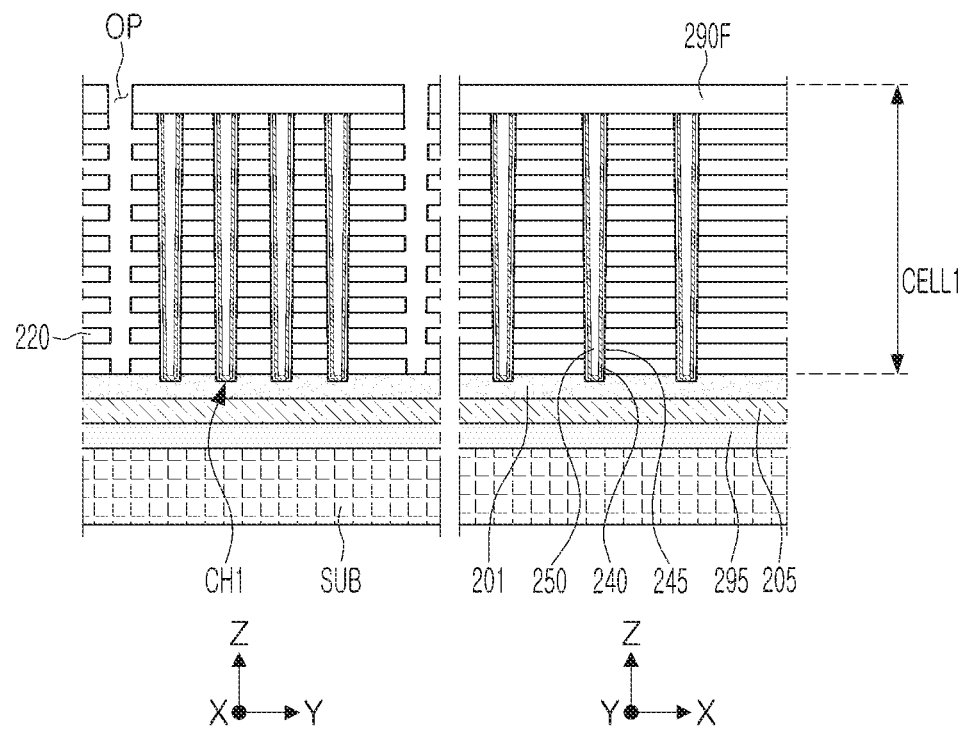
Figure 13D:
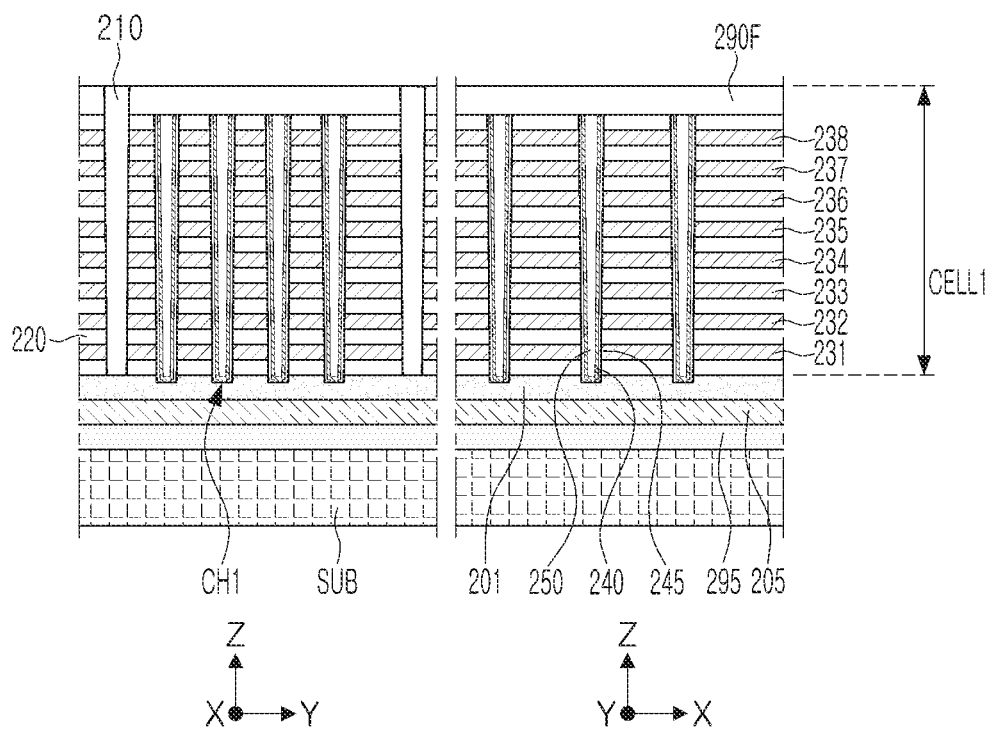
Figure 13E:
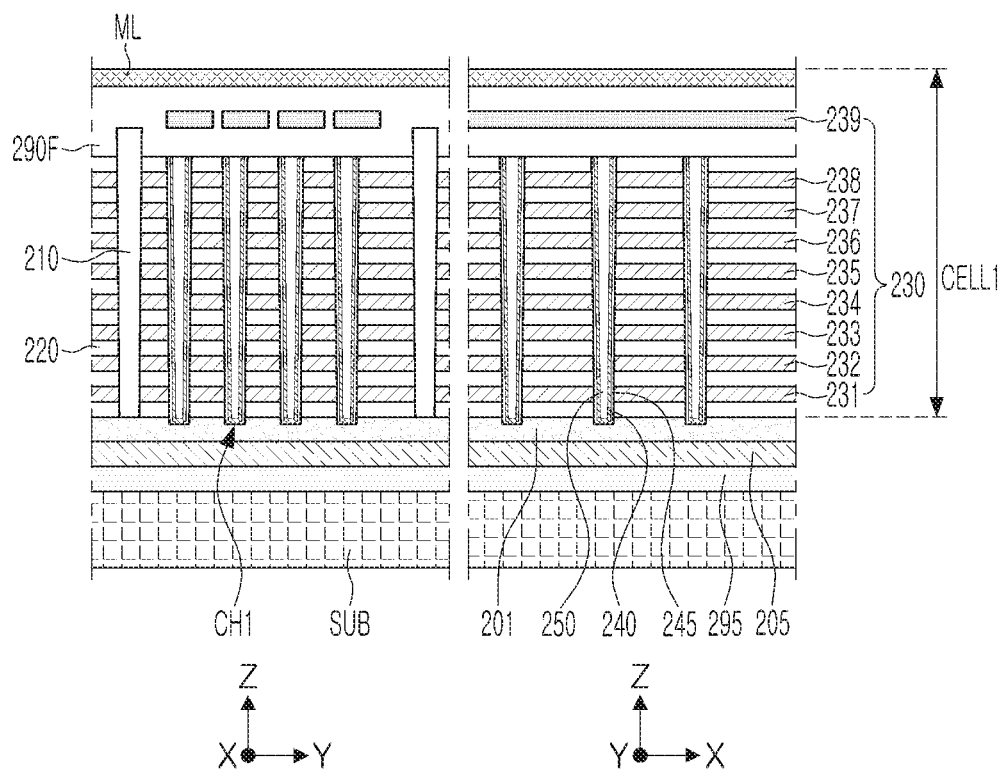
Figure 13F:
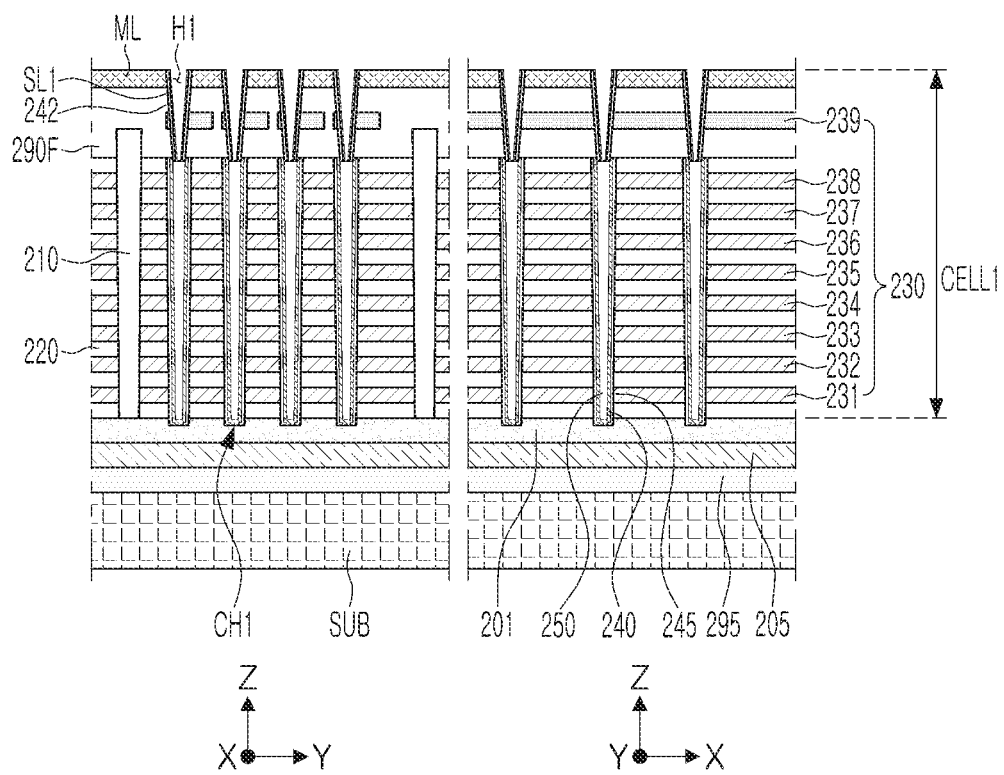
Figure 13G:
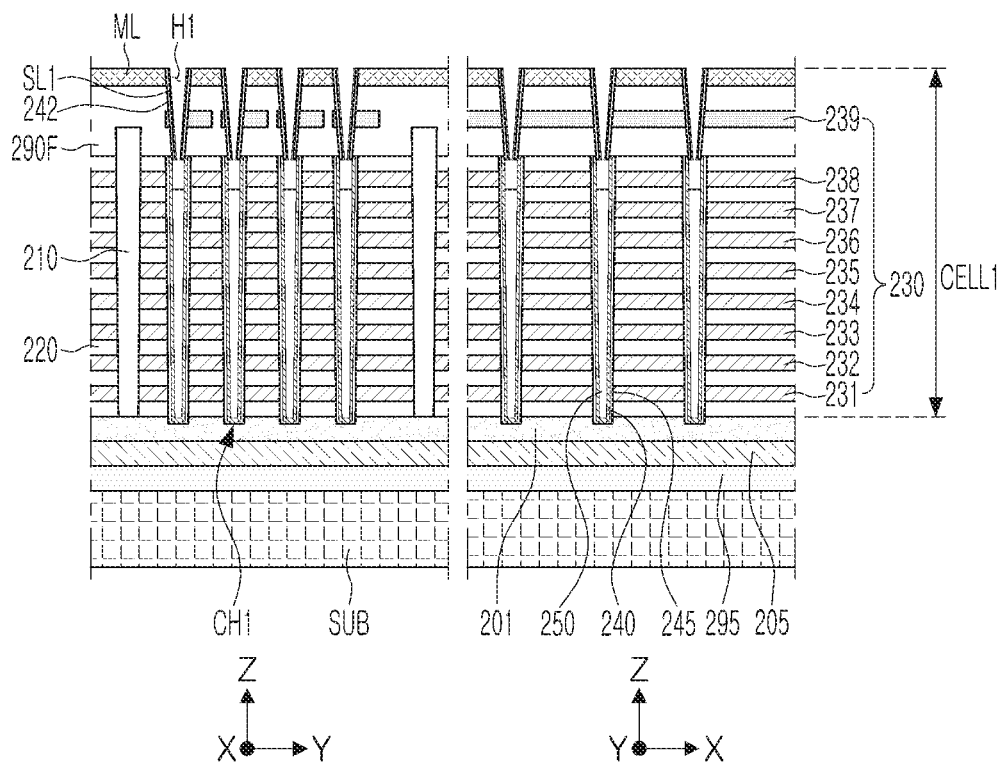
Figure 13H:
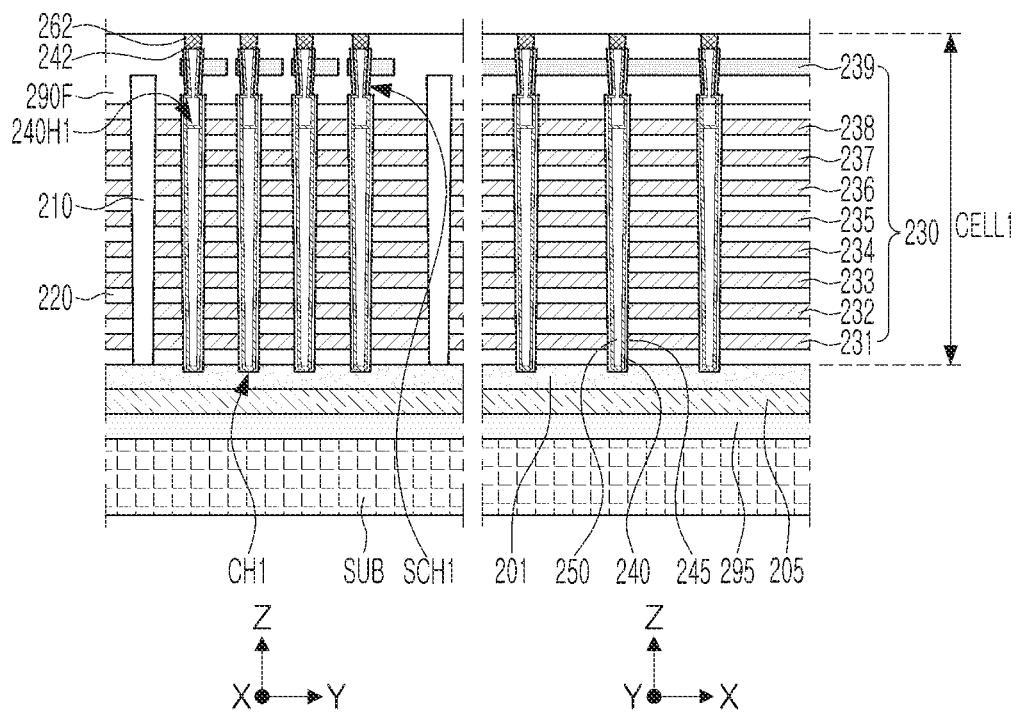
Figure 13I:
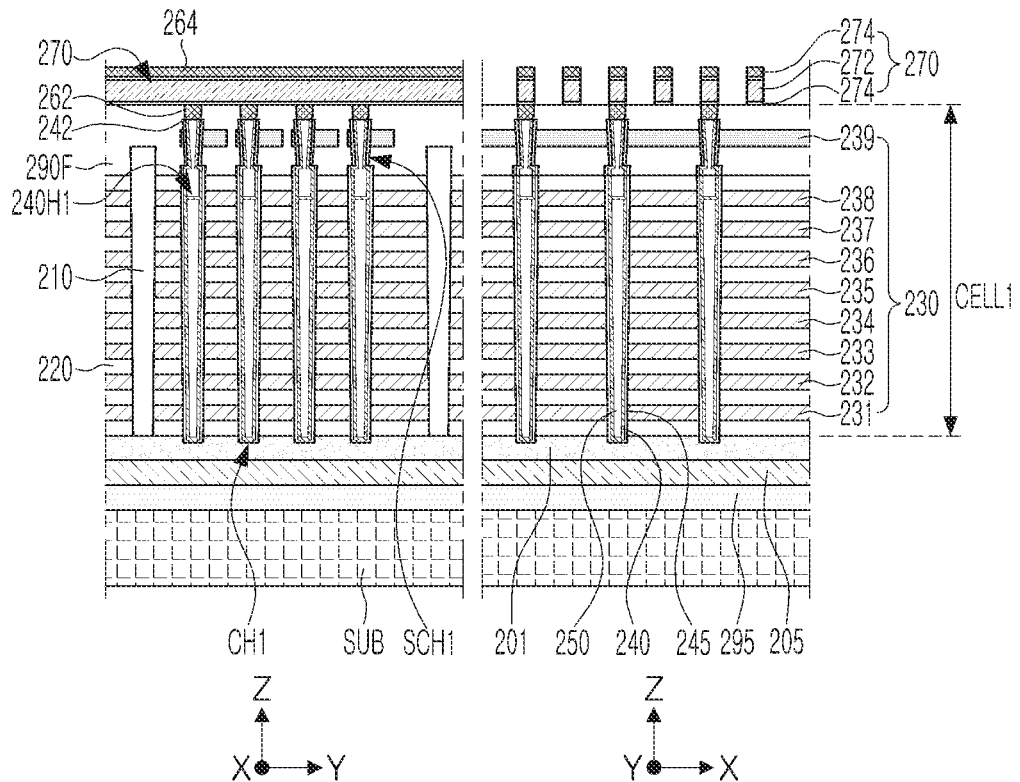
Figure 13J:
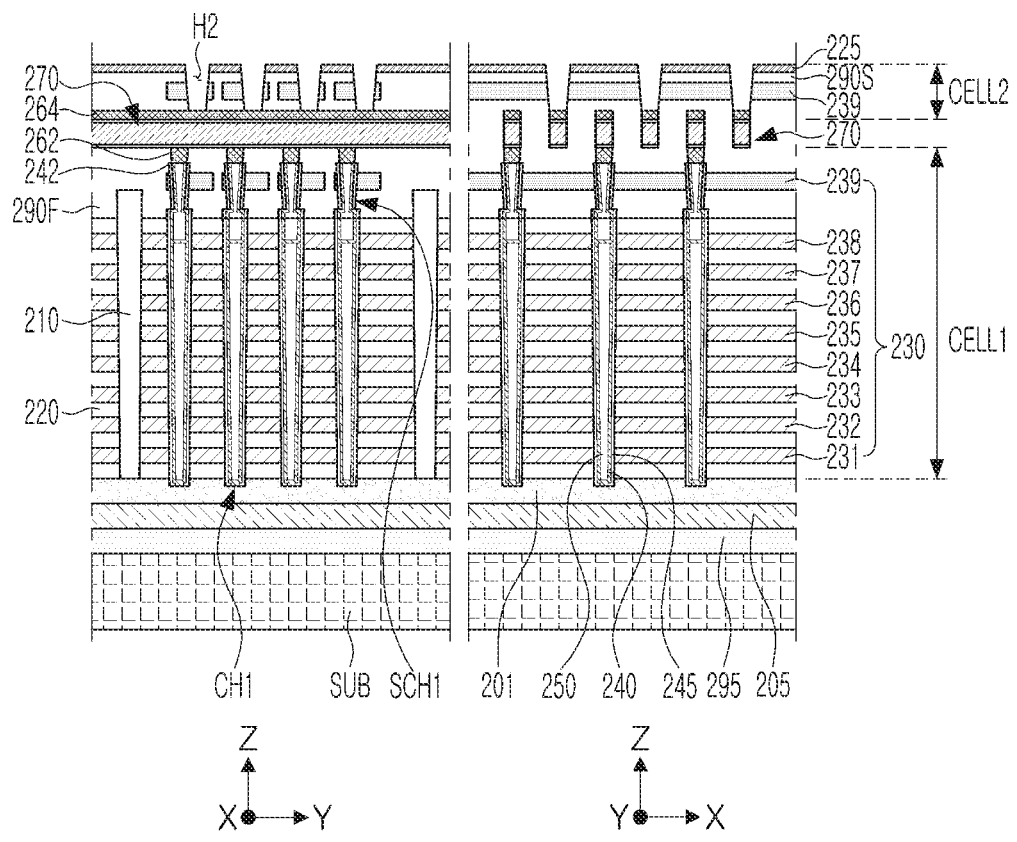
Figure 13K:
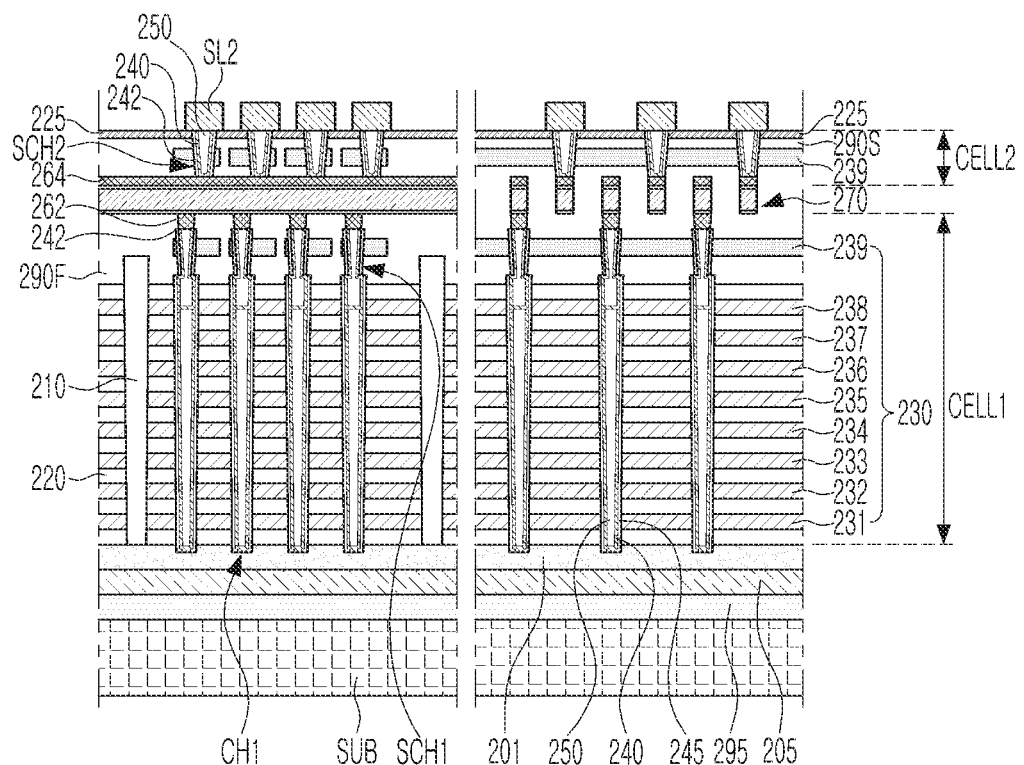
Figure 13L:
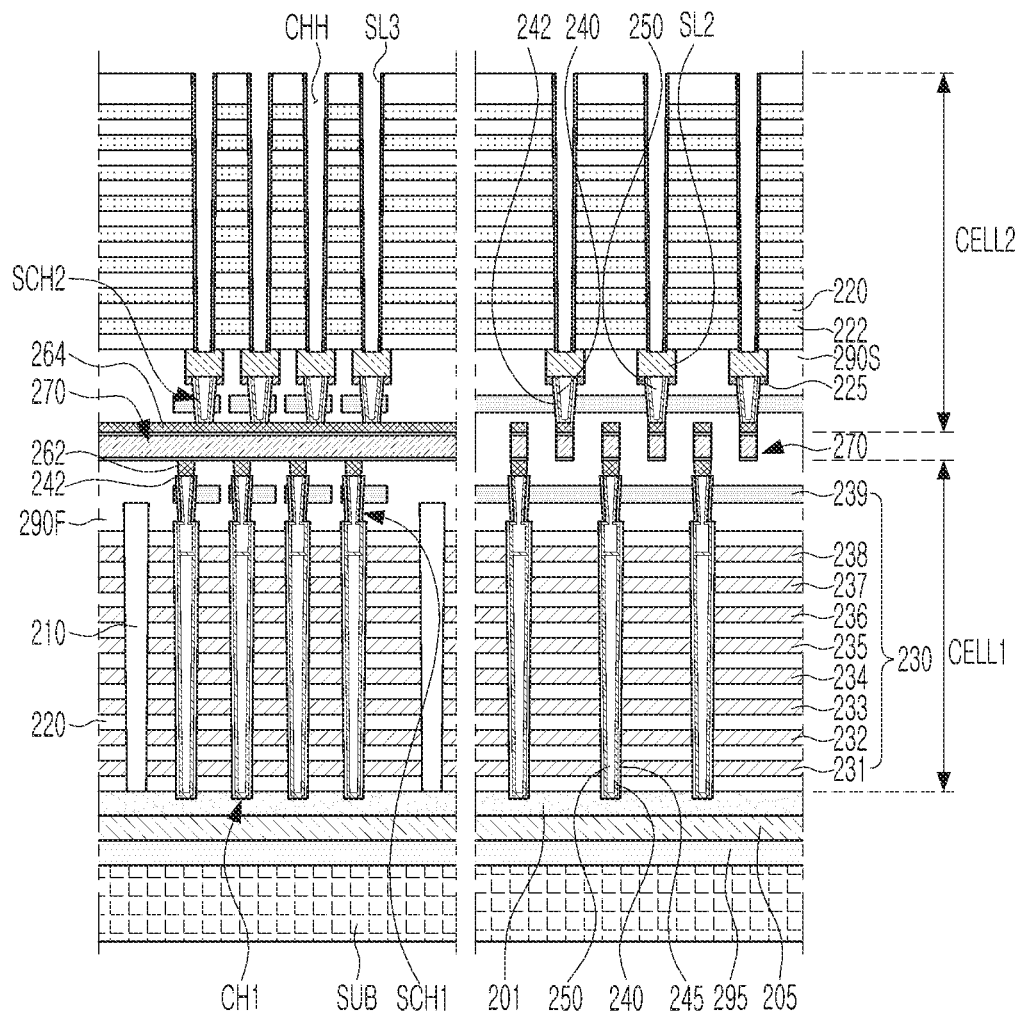
Figure 13M:
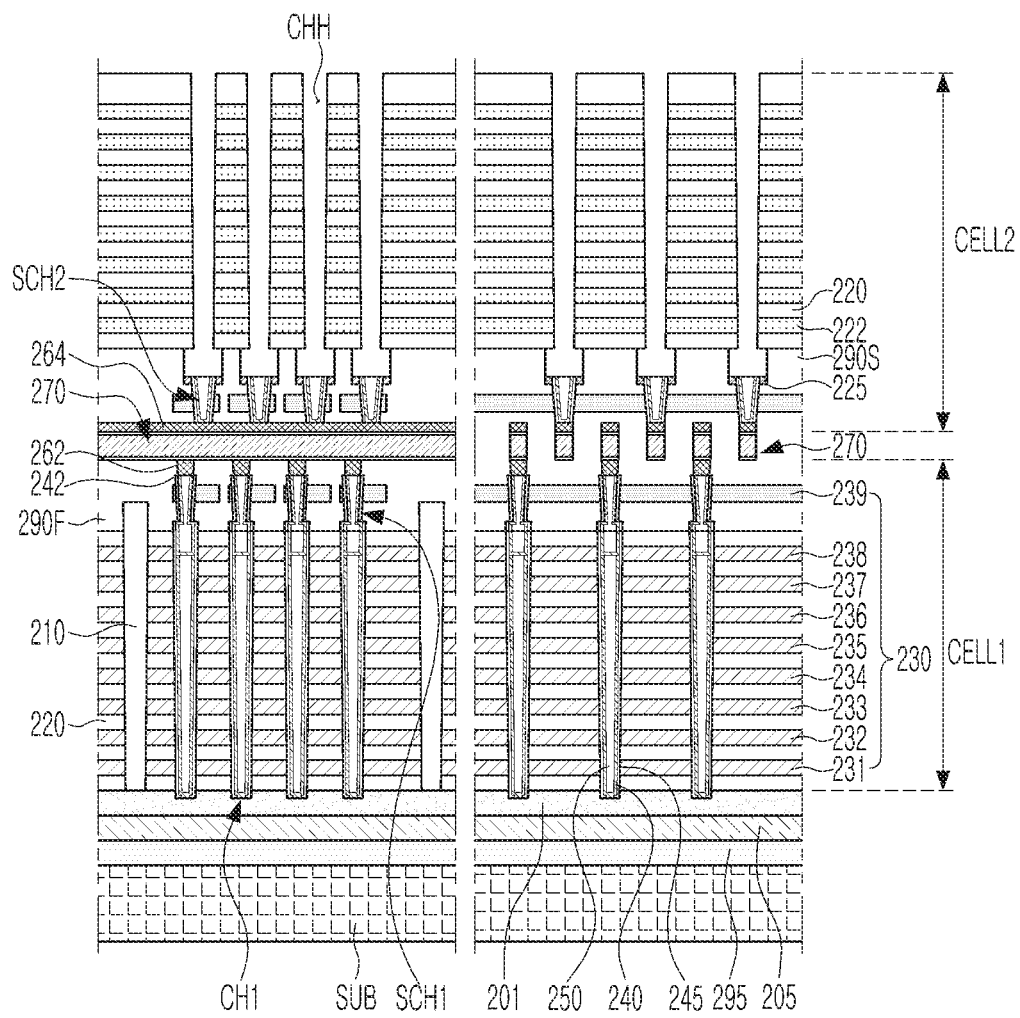
Figure 13N:
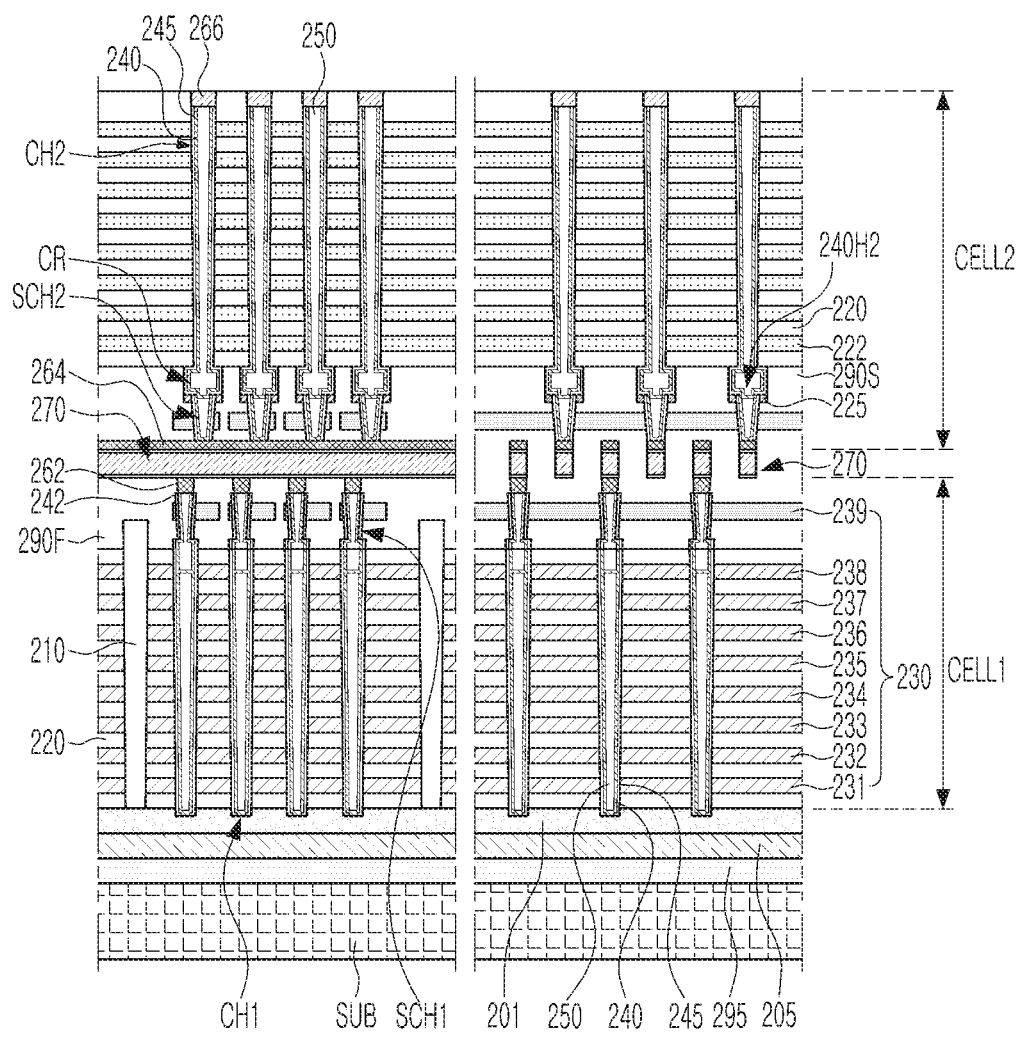
Figure 13O:
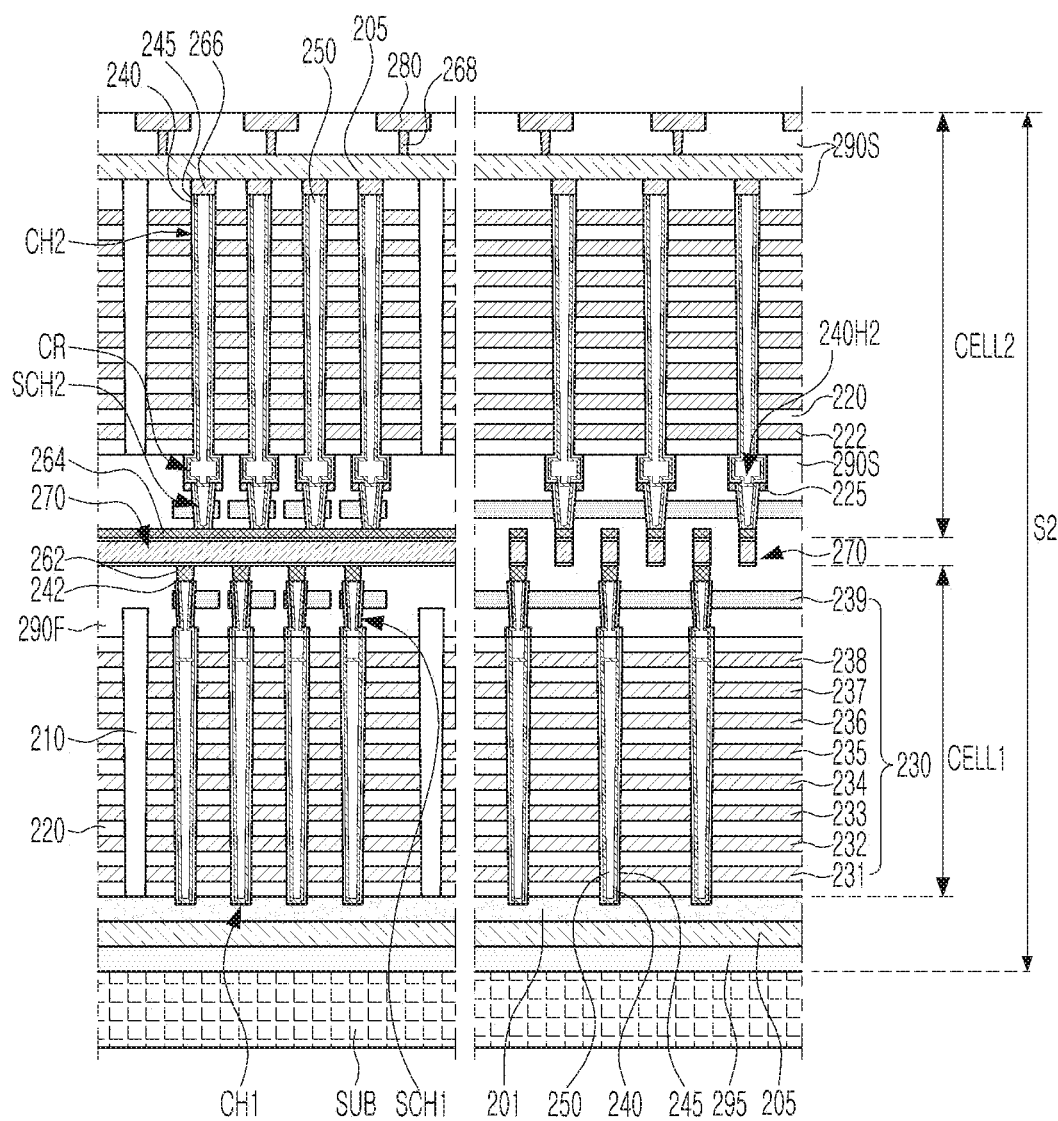
Figure 13P:
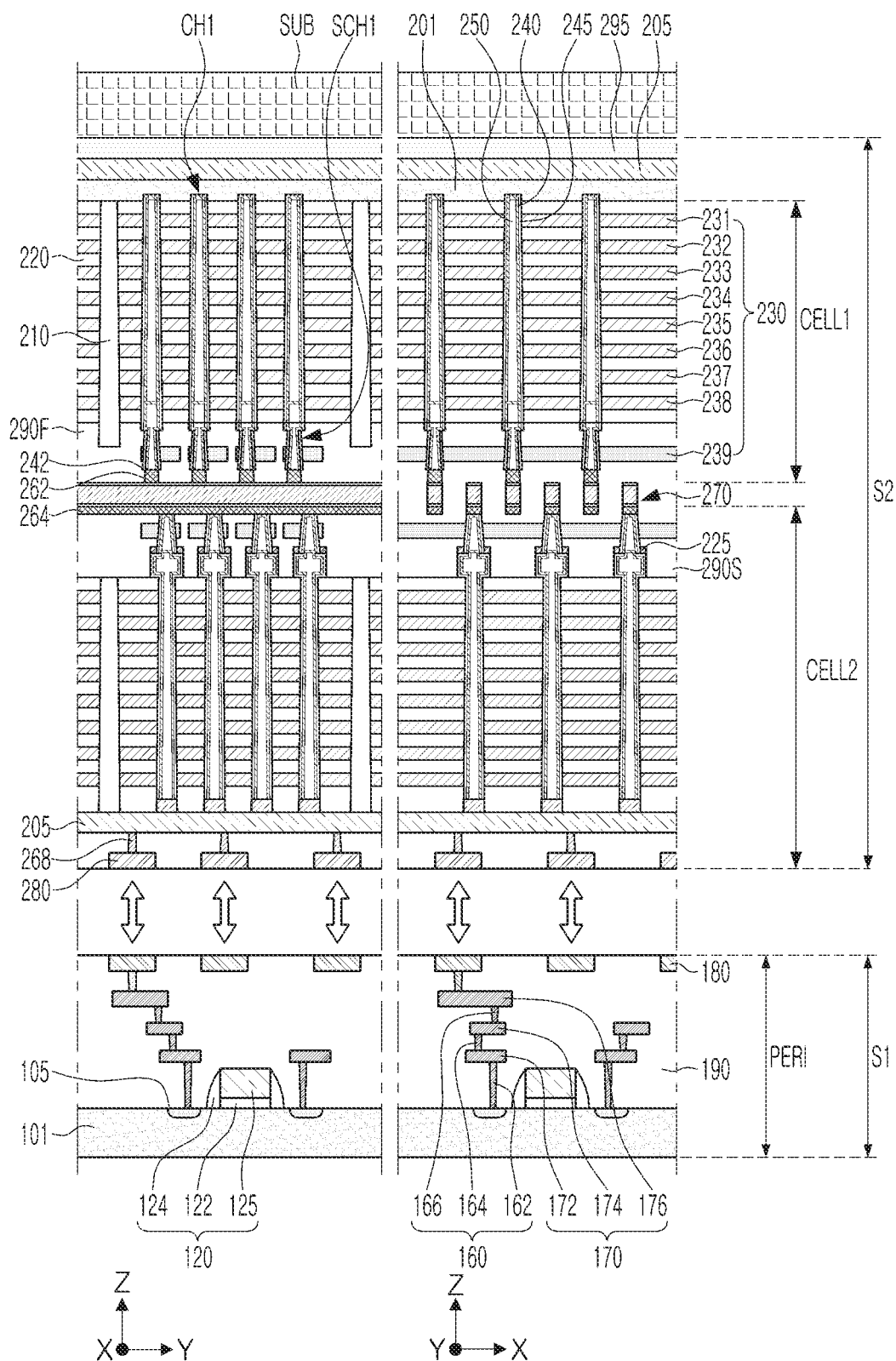

FIGS. 13A to 13P are schematic cross-sectional views illustrating a method of manufacturing a semiconductor device according to some example embodiments. FIGS. 13A to 13P illustrate regions corresponding to FIG. 4.

Referring to FIG. 13A, the second semiconductor structure S2 of FIG. 4 may be formed. To this end, an outermost insulation layer 295, a source layer 205, and a base layer 201 may be sequentially formed on a base substrate SUB, and gate sacrificial layers 222 and interlayer insulation layers 220 may be alternately stacked thereon.

The base substrate SUB may be a layer to be removed through a subsequent process, and may be a semiconductor substrate such as silicon (Si).

The gate sacrificial layers 222 may be a layer that may be replaced with gate electrodes 230 through a subsequent process. The gate sacrificial layers 222 may be formed of a material that may be etched with etch selectivity to the interlayer insulation layers 220. For example, the interlayer insulation layer 220 may be formed of at least one of silicon oxide and silicon nitride, and the gate sacrificial layers 222 may be formed of an interlayer insulation layer 220 selected from silicon, silicon oxide, silicon carbide, and silicon nitride, and other materials. In some example embodiments, thicknesses of the interlayer insulation layers 220 may not be all the same to each other. A photolithography process and an etching process may be repeatedly carried out on the gate sacrificial layers 222 and the interlayer insulation layers 220, to extend upper portions of the gate sacrificial layers 222 shorter than lower portions of gate sacrificial layers 222 at un-illustrated end portions in the x direction. Thereby, the gate sacrificial layers 222 may be formed in a stepped shape.

Referring to FIG. 13B, first channel structures CH1 may be formed to pass through a stacked structure of the gate sacrificial layers 222 and the interlayer insulation layers 220.

In order to form the first channel structures CH1, first, the stacked structure may be anisotropically etched to form channel holes. Due to the height of the stacked structure, side walls of the channel holes may not be perpendicular to an upper surface of the base layer 201. In some example embodiments, the channel holes may be formed to recess a portion of the base layer 201. The channel holes may not extend to the source layer 205.

Next, a channel layer 240, a gate dielectric layer 245, and a channel embedded insulation layer 250 may be formed in each of the channel holes, to form the first channel structures CH1. The gate dielectric layer 245 may be formed to have a uniform thickness using an atomic layer deposition (ALD) process or a chemical vapor deposition (CVD) process. In this operation, at least a portion of the gate dielectric layer 245 may be formed to extend vertically along the channel layer 240. The channel layer 240 may be formed on the gate dielectric layer 245 in the first channel structures CH1. The channel embedded insulation layer 250 may be formed to fill the first channel structures CH1, and may be an insulating material. According to some example embodiments, a space inside of the channel layers 240 may be filled with a conductive material other than the channel embedded insulation layer 250.

Referring to FIG. 13C, openings OP may be formed through the stacked structure of the gate sacrificial layers 222 and the interlayer insulation layers 220, and the gate sacrificial layers 222 may be removed through the openings OP.

The openings OP may be formed in a trench shape extending in the x direction. Before formation of the openings OP, a portion of a first cell region insulation layer 290F may be formed to cover the first channel structures CH1. The gate sacrificial layers 222 may be selectively removed with respect to the interlayer insulation layers 220, for example, using a wet etching process. As a result, side walls of the first channel structures CH1 may be partially exposed between the interlayer insulation layers 220.

Referring to FIG. 13D, a portion of gate electrodes 231 to 238 may be formed in regions from which the gate sacrificial layers 222 are removed.

The gate electrodes 231 to 238 may be formed by filling a conductive material in regions from which the gate sacrificial layers 222 are removed. The gate electrodes 231 to 238 may include a metal, polycrystalline silicon, or metal silicide material. In some example embodiments, when the gate dielectric layer 245 has a region extending horizontally along the gate electrodes 231 to 238, prior to the formation of the gate electrodes 231 to 238, the region of the gate dielectric layer 245 may be formed first. Next, separation insulation layers 210 may be formed by filling the openings OP with an insulating material.

Referring to FIG. 13E, upper gate electrodes 239 and a mask layer ML may be formed on the first channel structures CH1 and the separation insulation layers 210.

The upper gate electrodes 239 may be disposed to be divided into a plurality of portions between a pair of the separation insulation layers 210 in the y direction. The upper gate electrodes 239 may be formed of the same or different materials as the other gate electrodes 231 to 238. For example, the upper gate electrodes 239 may be made of a semiconductor material including impurities such as, for example, n-type impurities, and the other gate electrodes 231 to 238 may be made of a metal material. A thickness of each of the upper gate electrodes 239 may be the same as or different from a thickness of each of the other gate electrodes 231 to 238, and may be, for example, thicker than a thickness of each of the other gate electrodes 231 to 238, but is not limited thereto. A portion of the first cell region insulation layer 290F may be formed on the upper gate electrodes 239, and then the mask layer ML may be formed.

Referring to FIG. 13F, first holes H1 may be formed through the upper gate electrodes 239 to be connected to the first channel structures CH1, and gate insulation layers 242 and first sacrificial layers SL1 may be formed in the first holes H1.

The first holes H1 may be formed to be recessed to a predetermined (or alternately given) depth into the channel embedded insulation layer 250 of the first channel structures CH1. Therefore, a diameter or width of a lower end of the first holes H1 may be smaller than a diameter of the upper end of the first channel structures CH1. A shape and depth that the first holes H1 are recessed into the first channel structures CH1 may be variously changed in some example embodiments. For example, the first holes H1 may recess and extend into the channel layers 240 and/or the gate dielectric layers 245 as well as the channel embedded insulation layer 250 of the first channel structures CH1. The first holes H1 may have a circular cross-section in the x-y plane, and may have a side surface sloped against or a side surface perpendicular to the upper surface of the base layer 201, and a shape of the side surface is not limited to that illustrated in the drawings.

The gate insulation layers 242 and the first sacrificial layers SL1 may be sequentially formed in side walls of the first holes H1. The gate insulation layers 242 and the first sacrificial layers SL1 may be not formed at the lower ends of the first holes H1, such that the channel embedded insulation layer 250 may be exposed through the lower ends of the first holes H1. The gate insulation layers 242 may be the same as or different from the gate dielectric layers 245 of the first channel structures CH1. The gate insulation layers 242 may be disposed in a manner not connected to the gate dielectric layers 245 of the first channel structures CH1, but is not limited thereto. The first sacrificial layers SL1 may be made of a material different from the channel embedded insulation layer 250, and may have etching selectivity with respect to the channel embedded insulation layer 250. For example, the first sacrificial layers SL1 may be made of the same material as that of the channel layers 240.

Referring to FIG. 13G, a portion of the channel embedded insulation layer 250 may be removed from the lower portion of the first holes H1.

The channel embedded insulation layer 250 exposed through the lower ends of the first holes H1 may be selectively removed to a predetermined (or alternately given) depth using, for example, wet etching. For example, when the channel embedded insulation layer 250 is made of the same material as that of the gate insulation layers 242, the gate insulation layers 242 beside the mask layer ML and the gate insulation layers 242 at the lower portion of the first holes H1 in this operation may be partially removed together. Positions of the upper and lower ends of the remaining gate insulation layers 242 are not limited to those illustrated in the drawings, and it is also possible to be disposed closer to the upper gate electrodes 239.

Referring to FIG. 13H, the first sacrificial layers SL1 may be removed from the first holes H1, and the channel layers 240 and the channel embedded insulation layers 250 may be formed in the first holes H1 to form first string select channel structures SCH1, and first channel pads 262 may be then formed.

First, the first sacrificial layers SL1 may be selectively removed with respect to the gate insulation layers 242, the gate dielectric layers 245, and the channel embedded insulation layers 250. For example, when the channel layers 240 of the first channel structures CH1 are made of the same material as that of the first sacrificial layers SL1, the channel layers 240 exposed from the upper portion of the first channel structures CH1 may also be removed to expose a portion of the gate dielectric layers 245.

Next, an additional region of the channel layers 240 may be formed on the gate insulation layers 242 and the exposed gate dielectric layers 245 to be connected to the channel layers 240 of the first channel structures CH1. An additional region of the channel embedded insulation layers 250 may be formed on the channel layers 240 to fill the first holes H1. Thereby, the first string select channel structures SCH1 arranged on the first channel structures CH1 may be formed. In this operation, the channel layers 240 may be formed to have a first horizontal portion 240H1 disposed on a region in which the channel embedded insulation layers 250 have been recessed in the first channel structures CH1. Accordingly, the first horizontal portion 240H1 may be formed to horizontally cross the first channel structures CH1 in parallel with the upper surface of the base layer 201.

Next, the mask layer ML may be removed, and the channel embedded insulation layers 250 in the first string select channel structures SCH1 may be recessed to a predetermined (or alternately given) depth from the upper surface, to form first channel pads 262. As such, since the first channel pads 262 are formed after partially removing the upper ends of the first string select channel structures SCH1, when the first string select channel structures SCH1 have sloped side surfaces, the first channel pads 262 may also have a continuous sloped side surface. The first channel pads 262 may be made of a semiconductor material including impurities. According to some example embodiments, a portion of the channel layers 240 may remain, or a portion of the channel layers 240 and the gate insulation layer 242 may remain on side walls of the first channel pads 262.

Referring to FIG. 13I, common bit lines 270 and second channel pads 264 may be formed on the first channel pads 262.

The common bit lines 270 and the second channel pads 264 may be formed by stacking conductive layer 272 and barrier layers 274, forming the common bit lines 270, by using a deposition method such as physical vapor deposition (PVD), further stacking a material forming the second channel pads 264 thereon, and patterning the layers. Therefore, when the common bit lines 270 have a sloped side surface, the second channel pads 264 may have a continuous sloped side surface with respect to the common bit lines 270.

The common bit lines 270a according to the example embodiments of FIG. 6B may be manufactured by forming common bit lines 270a using a damascene method, removing a portion of common bit lines 270a from the upper portion, and forming the pad barrier layer 265 and the second channel pads 264. The common bit lines 270b according to the example embodiments of FIG. 6C may be manufactured by forming the common bit lines 270b using a damascene method, forming the pad barrier layer 265 on the upper surface of the common bit lines 270b, and forming the patterned second channel pads 264.

Referring to FIG. 13J, upper gate electrodes 239, a portion of a second cell region insulation layer 290S, and an etch stop layer 225 of a second memory cell region CELL2 may be formed on the common bit lines 270, and second holes H2 passing through the upper gate electrodes 239 and connected to the second channel pads 264 may be formed.

First, the upper gate electrodes 239 may be formed, in plural, between the pair of insulation layers 210 in the y direction, as in the first memory cell region CELL1 described above with reference to FIG. 13E. A portion of the second cell region insulation layer 290S and the etch stop layer 225 may be sequentially formed on the upper gate electrodes 239. The etch stop layer 225 may be used as a layer for patterning a second sacrificial layer SL2 in a subsequent process, and may be omitted, depending on example embodiments. The etch stop layer 225 may include at least one of, for example, SiN, SiCN, SiOC, SiON, and/or SiOCN.

Next, the second holes H2 may be formed to expose the upper surface of the second channel pads 264. The second holes H2 may be formed to have the same or smaller width than the second channel pads 264.

Referring to FIG. 13K, gate insulation layers 242, channel layers 240, and channel embedded insulation layers 250 may be formed in the second holes H2, to form second string select channel structures SCH2, and second sacrificial layers SL2 may be then formed on the second string select channel structures SCH2.

First, the second string select channel structures SCH2 may be formed by sequentially depositing the gate insulation layers 242, the channel layers 240, and the channel embedded insulation layers 250 in the second holes H2. The gate insulation layers 242 may only be formed on side walls of the second holes H2 to expose the second channel pads 264, and the channel layers 240 may be formed such that a lower end of the channel layers 240 is in contact with the second channel pads 264.

The second sacrificial layers SL2 may be formed on the second string select channel structures SCH2, for example, patterned to have a circular shape on a plane. The second sacrificial layers SL2 may be formed to have a larger diameter than the second string select channel structures SCH2. During the patterning process of the second sacrificial layers SL2, the etch stop layer 225 may be used for stopping an etching process. According to some example embodiments, a portion of the second cell region insulation layer 290S may be further formed on the etch stop layer 225 before the formation of the second sacrificial layers SL2.

Referring to FIG. 13L, gate sacrificial layers 222 and interlayer insulation layers 220 may be alternately stacked on the second sacrificial layers SL2, and channel holes CHH passing through the gate sacrificial layers 222 and the interlayer insulation layers 220, and third sacrificial layers SL3 on inner walls of the channel holes CHH may be formed.

An operation of removing the etch stop layer 225 between the second sacrificial layers SL2 may be further performed, before stacking of the gate sacrificial layers 222 and the interlayer insulation layers 220. This operation may be omitted, depending on example embodiments. The second cell region insulation layer 290S surrounding side surfaces of the second sacrificial layers SL2 may be additionally formed, before the stacking of the gate sacrificial layers 222 and the interlayer insulation layers 220.

After alternately stacking the gate sacrificial layers 222 and the interlayer insulation layers 220, the channel holes CHH may be formed on the second sacrificial layers SL2 to recess the second sacrificial layers SL2. According to some example embodiments, the channel holes CHH may be formed to expose the upper surface of the second sacrificial layers SL2 without recessing the second sacrificial layers SL2. The third sacrificial layers SL3 may only be formed on side walls of the channel holes CHH, such that the second sacrificial layers SL2 may be exposed at a lower end of the channel holes CHH. The third sacrificial layers SL3 may include a material different from that of the second sacrificial layers SL2.

Referring to FIG. 13M, after the second sacrificial layers SL2 are removed from lower portions of the channel holes CHH, the third sacrificial layers SL3 may be removed.

After selectively removing the second sacrificial layers SL2 exposed through the channel holes CHH, the third sacrificial layers SL3 may also be selectively removed. In some example embodiments, by removing a portion of the channel embedded insulation layers 250 together with the second and third sacrificial layers SL2 and SL3, the channel holes CHH may have an extended shape.

Referring to FIG. 13N, gate dielectric layers 245, channel layers 240, and channel embedded insulation layers 250 may be formed in the channel holes CHH, to form second channel structures CH2 and a connection region CR, and third channel pads 266 may be formed.

First, after forming the gate dielectric layers 245, an operation of forming sacrificial layers on the gate dielectric layers 245 may be further performed on the inner walls of the channel holes CHH. Next, after removing the gate dielectric layers 245 at an extended lower end of the channel holes CHH, the sacrificial layers may be removed. During this operation or through a separate operation, the channel embedded insulation layers 250 on the second string select channel structures SCH2 may be recessed to a predetermined (or alternately given) depth, and may then be removed. A depth to be recessed may be variously changed in a range in which the recessed portion is located higher than an upper surface of the upper gate electrodes 239 of the second memory cell region CELL2. According to some example embodiments, the channel embedded insulation layers 250 may be recessed in the above-described operation with reference to FIG. 13M.

Next, by forming the channel layers 240 and the channel embedded insulation layers 250 on the gate dielectric layers 245, the connection regions CR may be formed in extended regions of the channel holes CHH in which the second sacrificial layers SL2 were formed, and the second channel structures CH2 may be formed on the connection regions CR. The channel layers 240 may have a second horizontal portion 240H2, extending horizontally on the upper surface of the base layer 201, on the channel embedded insulation layers 250 in the second string select channel structures SCH2.

The third channel pads 266 may be formed by depositing a conductive material on the upper end of the second channel structures CH2. The third channel pads 266 may be formed after partially removing the channel embedded insulation layers 250 and the like from the upper end of the second channel structures CH2, or may be formed on the upper surface of the channel embedded insulation layers 250.

Referring to FIG. 13O, in the second memory cell region CELL2, gate electrodes 230 and separation insulation layers 210 may be formed, and a source layer 205, connection portions 268, and second bonding pads 280 may be sequentially formed.

The gate electrodes 230 may be formed after removing the gate sacrificial layers 222 using the openings OP, as in the first memory cell region CELL1 described above with reference to FIGS. 13C and 13D. The insulation layers 210 may be formed by depositing an insulating material in the openings.

Next, the source layer 205 may be formed in a plate shape, to be connected to the third channel pads 266. The connection portions 268 and the second bonding pads 280 may be sequentially formed on the source layer 205. The second bonding pads 280 may be formed, for example, by deposition and patterning operations of a conductive material. An upper surface of the second bonding pads 280 may be exposed through the second cell region insulation layer 290S, and may form a portion of an upper surface of a second semiconductor structure S2. According to some example embodiments, the upper surface of the second bonding pads 280 may be formed to protrude above the upper surface of the second cell region insulation layer 290S. In this operation, the second semiconductor structure S2 may be finally prepared.

Referring to FIG. 13P, the second semiconductor structure S2 may be bonded onto a first semiconductor structure S1.

First, the first semiconductor structure S1 may be prepared by forming circuit elements 120 and circuit wiring structures on a substrate 101.

A circuit gate dielectric layer 122 and a circuit gate electrode 125 may be sequentially formed on the substrate 101. The circuit gate dielectric layer 122 and the circuit gate electrode 125 may be formed using an ALD or CVD process. The circuit gate dielectric layer 122 may be formed of silicon oxide, and the circuit gate electrode 125 may be formed of at least one of polycrystalline silicon or a metal silicide layer, but is not limited thereto. Next, a spacer layer 124 and source/drain regions 105 may be formed on both side walls of the circuit gate dielectric layer 122 and the circuit gate electrode 125. According to some example embodiments, the spacer layer 124 may be comprised of a plurality of layers. Next, an ion implantation operation may be performed to form the source/drain regions 105.

Circuit contact plugs 160 of the circuit wiring structures may be formed by forming a portion of a peripheral region insulation layer 190, etching and removing the portion of the peripheral region insulation layer 190, and filling a conductive material therein. Circuit wiring lines 170 may be formed, for example, by depositing and patterning a conductive material.

The peripheral region insulation layer 190 may include a plurality of insulation layers. The peripheral region insulation layer 190 may be formed to finally cover the circuit elements 120 and the circuit wiring structures by partially forming in each of the operations of forming the circuit wiring structures, and forming a portion thereof in an upper portion of a third circuit wiring line 176.

The first semiconductor structure S1 and the second semiconductor structure S2 may be connected to each other by press bonding first bonding pads 180 and second bonding pads 280. The second semiconductor structure S2 on the first semiconductor structure S1 may be inverted such that the second bonding pads 280 are bonded to face in a downward direction. For ease of the understanding thereof, the second semiconductor structure S2 was illustrated to be bonded in the form of a mirror image of the structure illustrated in FIG. 13O. The first semiconductor structure S1 and the second semiconductor structure S2 may be directly bonded without an adhesive such as a separate adhesive layer. For example, the first bonding pads 180 and the second bonding pads 280 may form bonds at the atomic level by a pressing operation. According to some example embodiments, a surface treatment operation such as a hydrogen plasma treatment may be further performed on the upper surface of the first semiconductor structure S1 and the lower surface of the second semiconductor structure S2, to enhance the binding force, before the bonding.

In some example embodiments, when the second cell region insulation layer 290S includes the above-described bonding dielectric layer in the upper portion and the first semiconductor structure S1 also has the same layer, the binding force by bonding between the first and second bonding pads 180 and 280, as well as by dielectric bonding between the bonding dielectric layers may be further secured.

Next, referring to FIG. 4 together, the base substrate SUB of the second semiconductor structure S2 may be removed from the bonding structures of the first and second semiconductor structures S1 and S2.

By removing the base substrate SUB, the thickness of the semiconductor device may be reduced, or minimized, and the formation of structures for wiring such as a through via may be omitted. The base substrate SUB may be partially removed from the upper surface by a polishing operation such as a grinding process, and the remaining portion thereof may be removed by an etching operation such as a wet etching process. The outermost insulation layer 295 may be exposed in an upward direction. Therefore, the semiconductor device 100 of FIG. 4 may be finally manufactured.

Figure 14:
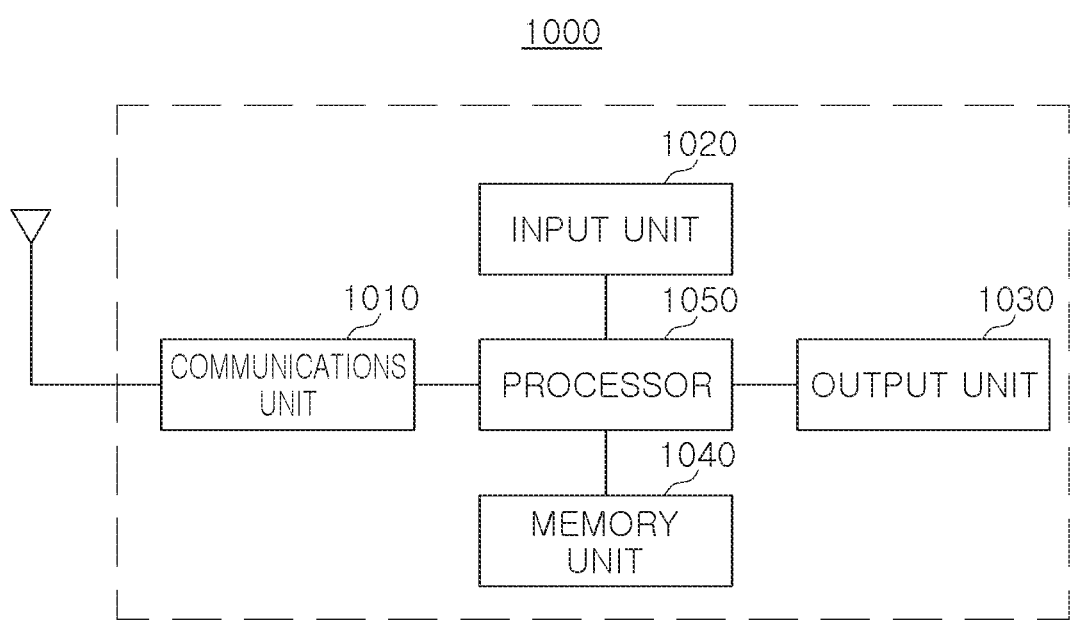
FIG. 14 is a block diagram illustrating an electronic device including a semiconductor device according to some example embodiments.

FIG. 14 is a block diagram illustrating an electronic device including a semiconductor device according to some example embodiments.

Referring to FIG. 14, an electronic device 1000 according to some example embodiments may include a communications unit 1010, an input unit 1020, an output unit 1030, a memory 1040, and/or a processor 1050.

The communications unit 1010 may include a wired/wireless communications module, and may include a wireless internet module, a short distance communications module, a global positioning system (GPS) module, a mobile communications module, and the like. The wired/wireless communications module included in the communications unit 1010 may be connected to an external communications network to transmit and receive data, according to various communications standards. The input unit 1020 may include a mechanical switch, a touch screen, a voice recognition module, and the like, as modules provided by a user to control operations of the electronic device 1000, and may further include various sensor modules through which a user may input data. The output unit 1030 may output information processed in the electronic device 1000 in a form of voice or image, and the memory 1040 may store a program or data for processing and controlling the processor 1050. The memory 1040 may include one or more semiconductor devices according to various example embodiments, such as those discussed above with reference to FIGS. 4 to 12, and may be embedded within the electronic device 1000, or may communicate with the processor 1050 through a separate interface. The processor 1050 may control operations of each portion included in the electronic device 1000. The processor 1050 may perform control and processing related to voice communications, video communications, data communications, and the like, or may also perform control and processing for multimedia reproduction and management. In addition, the processor 1050 may process input transferred from the user through the input unit 1020, may output the result through the output unit 1030, and may store data for controlling the operation of the electronic device 1000 in the memory 1040, or may read it from the memory 1040.

According to some example embodiments of the present inventive concepts, in a structure in which two memory cell structures share a bit line, a semiconductor device with improved connectivity and reliability may be provided, by improving or optimizing the placement of the channel pads above and below the bit line.

The various and advantageous advantages and effects of the present inventive concepts are not limited to the above description, and can be more easily understood in the course of describing specific example embodiments of the present inventive concepts.

While the present inventive concepts have been shown and described with reference to example embodiments thereof, it will be apparent to those skilled in the art that modifications and variations could be made thereto without departing from the scope of the present inventive concepts as defined by the appended claims.

What is claimed is:

1. A semiconductor device comprising:
a first semiconductor structure comprising a substrate and a circuit element on the substrate; and
a second semiconductor structure connected to the first semiconductor structure, the second semiconductor structure comprising:
a base layer;
a first memory cell structure comprising:
first gate electrodes on a first surface of the base layer, spaced apart from one another in a direction perpendicular to the first surface of the base layer;
first channel structures passing through a portion of the first gate electrodes; and
first string select channel structures connected to the first channel structures at one end of the first channel structures, the first string select channel structures passing through a portion of the first gate electrodes;
a second memory cell structure comprising:
second gate electrodes vertically overlapping the first gate electrodes and spaced apart from each other in the direction perpendicular to the first surface of the base layer;
second channel structures passing through a portion of the second gate electrodes;
second string select channel structures connected to the second channel structures at one end of the second channel structures, the second string select channel structures passing through a portion of the second gate electrodes; and
connection regions between the second channel structures and the second string select channel structures, the connection regions having a width wider than a width of the second channel structures and a width of the second string select channel structures; and
common bit lines between the first memory cell structure and the second memory cell structure, the common bit lines electrically connected to the first and second string select channel structures in common,
wherein
the first memory cell structure further comprises first channel pads between the common bit lines and the first string select channel structures, and
the second memory cell structure further comprises second channel pads along the common bit lines on first surfaces of the common bit lines facing the second memory cell structure.

2. The semiconductor device according to claim 1, wherein
the first channel pads are on second surfaces of the common bit lines, opposite to the first surfaces of the common bit lines, and confined to regions connected to the first string select channel structures.

3. The semiconductor device according to claim 1,
wherein the first string select channel structures comprise channel layers therein, and
wherein the first channel pads have a width substantially the same as a width of an outer wall of the channel layers in the first string select channel structures on an interface between the first channel pads and the first string select channel structures.

4. The semiconductor device according to claim 1, wherein the second channel pads have a first thickness in a region not connected to the second string select channel structures, and a second thickness in a region connected to the second string select channel structures, the second thickness being less than the first thickness.

5. The semiconductor device according to claim 1,
wherein the common bit lines comprise conductive layers and barrier layers on the conductive layers, and
wherein the barrier layers are between the first and second channel pads and the conductive layers.

6. The semiconductor device according to claim 1,
wherein the first and second gate electrodes include first and second string select gate electrodes, respectively, adjacent to the common bit lines,
wherein the first and second string select channel structures pass through the first and second string select gate electrodes, and
wherein the first and second string select gate electrodes constitute string select transistors.

7. The semiconductor device according to claim 1, wherein the first and second channel structures comprise gate dielectric layers and channel layers therein, sequentially arranged from the first and second gate electrodes, respectively,
wherein the channel layers extend from the first and second channel structures into the first and second string select channel structures, respectively.

8. The semiconductor device according to claim 1, wherein the first and second channel pads are semiconductor layers containing impurities.

9. The semiconductor device according to claim 1, wherein the first and second semiconductor structures further comprise first and second bonding pads bonded to each other.

10. The semiconductor device according to claim 6,
wherein the first and second string select gate electrodes comprise a material different from a material of the first and second gate electrodes constituting memory cells.

11. The semiconductor device according to claim 6, wherein the second memory cell structure further comprises an etch stop layer surrounding a portion of the second string select channel structures adjacent to the connection regions.

12. The semiconductor device according to claim 7, wherein, in the first memory cell structure, the gate dielectric layers do not extend into the first string select channel structures.

13. The semiconductor device according to claim 7, wherein, in the first memory cell structure, the channel layers include a first horizontal portion extending in parallel with the first surface of the base layer, and intersecting the first channel structures in a region of the first channel structures adjacent to the first string select channel structures.

14. The semiconductor device according to claim 7, wherein, in the second memory cell structure, the gate dielectric layers extend into the connection regions and do not extend into the second string select channel structures.

15. The semiconductor device according to claim 7, wherein, in the second memory cell structure, the channel layers include a second horizontal portion extending in parallel with the first surface of the base layer, and intersecting the second string select channel structures in a region of the second string select channel structures adjacent to the connection regions.

16. The semiconductor device according to claim 7,
wherein the first and second string select channel structures further comprise gate insulation layers between the first and second gate electrodes and the channel layers, respectively, and
wherein the gate dielectric layers comprise a material different from a material of the gate insulation layers.

17. A semiconductor device comprising:
a base layer;
first gate electrodes on a first surface of the base layer, spaced apart from one another in a direction perpendicular to the first surface of the base layer;
first channel structures passing through at least a portion of the first gate electrodes, and including first channel layers;
second gate electrodes on one side of the first gate electrodes and spaced apart from each other in the direction perpendicular to the first surface of the base layer;
second channel structures passing through at least a portion of the second gate electrodes, and including second channel layers;
common bit lines between the first gate electrodes and the second gate electrodes and electrically connected to the first and second channel layers in common;
first channel pads between one end of the first channel structures and a first surface of the common bit lines; and
second channel pads along the common bit lines on second surfaces of the common bit lines, opposite to the first surface of the common bit lines.

18. The semiconductor device according to claim 17, further comprising:
a peripheral circuit region on a second surface of the base layer, opposite to the first surface of the base layer, the peripheral circuit comprising a substrate and a circuit element on the substrate.

19. The semiconductor device according to claim 17, further comprising:
a first source layer on a second surface of the base layer, opposite to the first surface of the base layer, the first source layer extending in parallel with the second surface of the base layer, and configured to apply an electrical signal to the first channel structures.

20. A semiconductor device comprising:
a first semiconductor structure comprising a substrate and a circuit element on the substrate; and
a second semiconductor structure on the first semiconductor structure,
wherein the second semiconductor structure comprises:
a base layer;
a first memory cell structure comprising:
first gate electrodes on a first surface of the base layer, spaced apart from each other in a direction perpendicular to the first surface of the base layer;
first channel structures passing through a portion of the first gate electrodes;
first string select channel structures connected to the first channel structures at one end of the first channel structures, the first string select channel structures passing through a portion of the first gate electrodes; and
first channel pads at one end of the first string select channel structures;
a second memory cell structure comprising:
second gate electrodes vertically overlapping the first gate electrodes and spaced apart from each other in a direction perpendicular to the first surface of the base layer;
second channel structures passing through a portion of the second gate electrodes;
second string select channel structures connected to the second channel structures at one end of the second channel structures, the second string select channel structures passing through a portion of the second gate electrodes; and
second channel pads at one end of the second string select channel structures; and
common bit lines between the first memory cell structure and the second memory cell structure, the common bit lines electrically connected to the first and second channel structures in common, wherein
the first and second channel pads are arranged asymmetrically with respect to each other, based on the common bit lines.

* * * * *